US011837457B2

(12) United States Patent
Noori et al.

(10) Patent No.: US 11,837,457 B2
(45) Date of Patent: Dec. 5, 2023

(54) PACKAGING FOR RF TRANSISTOR AMPLIFIERS

(71) Applicant: Cree, Inc., Durham, NC (US)

(72) Inventors: Basim Noori, San Jose, CA (US); Marvin Marbell, Morgan Hill, CA (US); Scott Sheppard, Chapel Hill, NC (US); Kwangmo Chris Lim, San Jose, CA (US); Alexander Komposch, Morgan Hill, CA (US); Qianli Mu, San Jose, CA (US)

(73) Assignee: Wolfspeed, Inc., Durham, NC (US)

( * ) Notice: Subject to any disclaimer, the term of this patent is extended or adjusted under 35 U.S.C. 154(b) by 131 days.

(21) Appl. No.: 17/018,721

(22) Filed: Sep. 11, 2020

(65) Prior Publication Data

US 2022/0084950 A1    Mar. 17, 2022

(51) Int. Cl.
*H01L 23/538* (2006.01)
*H01L 23/498* (2006.01)
(Continued)

(52) U.S. Cl.
CPC .... *H01L 23/5389* (2013.01); *H01L 23/49811* (2013.01); *H01L 23/5386* (2013.01); *H01L 23/66* (2013.01); *H01L 24/16* (2013.01); *H01L 24/32* (2013.01); *H01L 25/16* (2013.01); *H01L 25/50* (2013.01); *H01L 29/41741* (2013.01);
(Continued)

(58) Field of Classification Search
CPC ............. H01L 23/66; H01L 2223/6616; H01L 2223/6655; H01L 29/41758; H01L 23/4334; H01L 23/49531; H01L 23/142; H01L 23/13; H01L 2223/6644; H01L 24/10; H01L 23/5389; H01L 29/41741; H01L 25/16; H03F 1/086; H03F 3/195; H03F 2200/451
See application file for complete search history.

(56) References Cited

U.S. PATENT DOCUMENTS 34,861 A    4/1862  Knowlton
4,946,547 A  8/1990  Palmour et al.
(Continued)

FOREIGN PATENT DOCUMENTS

CA    2511005 C    5/2016
CN    1757119 B    2/2011
(Continued)

OTHER PUBLICATIONS

"Search Report in corresponding application No. 110112069 dated Jun. 22, 2022, 11 pages".
(Continued)

*Primary Examiner* — Nelson Garces
*Assistant Examiner* — Quinton A Brasfield
(74) *Attorney, Agent, or Firm* — Myers Bigel, P.A.

(57) ABSTRACT

RF transistor amplifiers an RF transistor amplifier die having a semiconductor layer structure, an interconnect structure having first and second opposing sides, wherein the first side of the interconnect structure is adjacent a surface of the RF transistor amplifier die such that the interconnect structure and the RF transistor amplifier die are in a stacked arrangement, and one or more circuit elements on the first and/or second side of the interconnect structure.

24 Claims, 21 Drawing Sheets

(51) Int. Cl.
  *H01L 23/66* (2006.01)
  *H01L 23/00* (2006.01)
  *H01L 25/16* (2023.01)
  *H01L 25/00* (2006.01)
  *H01L 29/417* (2006.01)
  *H01L 29/423* (2006.01)

(52) U.S. Cl.
  CPC .. *H01L 29/4238* (2013.01); *H01L 2223/6644* (2013.01); *H01L 2223/6655* (2013.01); *H01L 2224/16227* (2013.01); *H01L 2224/32245* (2013.01); *H01L 2924/1033* (2013.01); *H01L 2924/10253* (2013.01); *H01L 2924/10272* (2013.01); *H01L 2924/10344* (2013.01); *H01L 2924/10346* (2013.01); *H01L 2924/13064* (2013.01); *H01L 2924/19105* (2013.01)

(56) References Cited

U.S. PATENT DOCUMENTS

| | | |
|---|---|---|
| 5,192,987 A | 3/1993 | Khan et al. |
| 5,200,022 A | 4/1993 | Kong et al. |
| 5,210,051 A | 5/1993 | Carter |
| 5,296,395 A | 3/1994 | Khan et al. |
| 5,309,012 A | 5/1994 | Jex et al. |
| RE34,861 E | 2/1995 | Davis et al. |
| 5,393,993 A | 2/1995 | Edmond et al. |
| 5,523,589 A | 6/1996 | Edmond et al. |
| 6,218,680 B1 | 4/2001 | Carter et al. |
| 6,316,793 B1 | 11/2001 | Sheppard et al. |
| 6,426,525 B1 | 7/2002 | Brindle |
| 6,548,333 B2 | 4/2003 | Smith |
| 6,825,559 B2 | 11/2004 | Mishra et al. |
| 7,030,428 B2 | 4/2006 | Saxler |
| 7,135,766 B1 | 11/2006 | Costa et al. |
| 7,354,782 B2 | 4/2008 | Mishra et al. |
| 7,544,963 B2 | 6/2009 | Saxler |
| 7,548,112 B2 | 6/2009 | Sheppard |
| 7,592,211 B2 | 9/2009 | Sheppard et al. |
| 7,615,774 B2 | 11/2009 | Saxler |
| 7,709,269 B2 | 5/2010 | Smith et al. |
| 7,851,909 B2 | 12/2010 | Mishra et al. |
| 7,906,799 B2 | 3/2011 | Sheppard et al. |
| 8,274,159 B2 | 9/2012 | Mishra et al. |
| 8,803,313 B2 | 8/2014 | Mishra et al. |
| 9,226,383 B2 | 12/2015 | Mishra et al. |
| 9,515,011 B2 | 12/2016 | Wood et al. |
| 9,947,616 B2 | 4/2018 | Wood et al. |
| 10,147,686 B1 | 12/2018 | Lessard et al. |
| 10,483,352 B1 | 11/2019 | Mokhti et al. |
| 2001/0038310 A1 | 11/2001 | Olofsson et al. |
| 2002/0066908 A1 | 6/2002 | Smith |
| 2002/0167023 A1 | 11/2002 | Chavarkar et al. |
| 2003/0102482 A1 | 6/2003 | Saxler |
| 2004/0061129 A1 | 4/2004 | Saxler et al. |
| 2006/0081985 A1 | 4/2006 | Beach et al. |
| 2006/0226498 A1 | 10/2006 | Davies |
| 2009/0256266 A1 | 10/2009 | Lao et al. |
| 2010/0059791 A1 | 3/2010 | Takagi |
| 2010/0059879 A1 | 3/2010 | Bielen |
| 2012/0063097 A1 | 3/2012 | Reza et al. |
| 2012/0104577 A1 | 5/2012 | Fukumura et al. |
| 2012/0168928 A1 | 7/2012 | Lao et al. |
| 2012/0280755 A1 | 11/2012 | Wright |
| 2014/0312458 A1 | 10/2014 | Ashrafzadeh et al. |
| 2014/0346569 A1 | 11/2014 | Vielemeyer et al. |
| 2016/0087588 A1* | 3/2016 | Szymanowski ......... H01L 23/66 330/307 |
| 2017/0271497 A1 | 9/2017 | Fayed et al. |
| 2018/0090475 A1 | 3/2018 | Zuo et al. |
| 2018/0122750 A1 | 5/2018 | Lu |
| 2019/0057924 A1* | 2/2019 | Kim ....................... H01L 24/17 |
| 2019/0110358 A1 | 4/2019 | Mu et al. |
| 2019/0149098 A1 | 5/2019 | Tanomura |
| 2019/0173195 A1* | 6/2019 | Kim ..................... H01Q 21/065 |
| 2019/0181099 A1 | 6/2019 | Then et al. |
| 2019/0280374 A1* | 9/2019 | Kim ..................... H01L 23/5383 |
| 2019/0304887 A1 | 10/2019 | Ganesan et al. |
| 2020/0075479 A1 | 3/2020 | Khalil et al. |
| 2020/0219866 A1 | 7/2020 | Cabahug et al. |
| 2020/0328721 A1 | 10/2020 | Nanan et al. |
| 2021/0313282 A1 | 10/2021 | Noori et al. |
| 2021/0313293 A1 | 10/2021 | Noori et al. |
| 2021/0336585 A1* | 10/2021 | Mares ..................... H01L 23/42 |
| 2021/0376807 A1 | 12/2021 | Lim et al. |
| 2022/0084950 A1 | 3/2022 | Noori et al. |

FOREIGN PATENT DOCUMENTS

| | | |
|---|---|---|
| CN | 204946885 U | 1/2016 |
| EP | 2518764 A2 | 10/2012 |
| EP | 2947472 A1 | 11/2015 |
| EP | 3629373 A1 | 4/2020 |
| EP | 3855486 A1 | 7/2021 |
| JP | 4830092 B2 | 9/2011 |
| JP | 2020507230 A | 3/2020 |
| KR | 101288153 B1 | 7/2013 |
| KR | 101371907 B1 | 3/2014 |
| TW | I333278 B | 11/2010 |
| WO | 9954935 A1 | 10/1999 |
| WO | 2004061973 A1 | 7/2004 |
| WO | 2009097564 A1 | 8/2009 |
| WO | 2019097564 A1 | 5/2019 |
| WO | 2020100219 A1 | 5/2020 |

OTHER PUBLICATIONS

Notification of Transmittal of the International Search Report and the Written Opinion of the International Searching Authority, or the Declaration, in corresponding PCT Application No. PCT/US2021/025102 (dated Dec. 13, 2021).

Notification of Transmittal of the International Search Report and the Written Opinion of the International Searching Authority, or the Declaration, in corresponding PCT Application No. PCT/US2021/025102 (Date: Dec. 13, 2021).

A schematic of Yole development vertical packaging (1 page) (2014).

Dumé, Isabelle "Nanowires give vertical transistors a boost" Physics World, Semiconductors and Electronics Research Update (2 pages) (Aug. 2, 2012).

Ramesh, S. "Laying Foundations For Vertical Transistor Manufacture" Compound Semiconductor (12 pages) (Sep. 20, 2018).

The definition of Redistribution Layers (RDLs), https://semiengineering.com/knowledge_centers/packaging/ redistribution-layers-rdls/ (2022).

"Office Action, corresponding to Taiwan Application No. 111125448, dated Aug. 19, 2022, 4 pgs (English Translation)—3 pgs. (Taiwanese)".

"International Preliminary Report on Patentability for International Patent Application No. PCTUS21048779, dated Mar. 23, 2023, 11 pages".

"International Preliminary Report on Patentability in International Patent Application No. PCTUS21034231, dated Dec. 15, 2022, 9 pages".

"Indian Examination Report in Corresponding Patent Application No. 202247061092, dated Jan. 5, 2023, 8 pages".

"Indian Examination Report in Corresponding Application No. 202247075828, dated Jul. 10, 2023, 6 pages".

"International Preliminary Report on Patentability and Written Opinion for corresponding International Application No. PCT/US2021/025102, dated Sep. 29, 2022, 13 pages".

\* cited by examiner

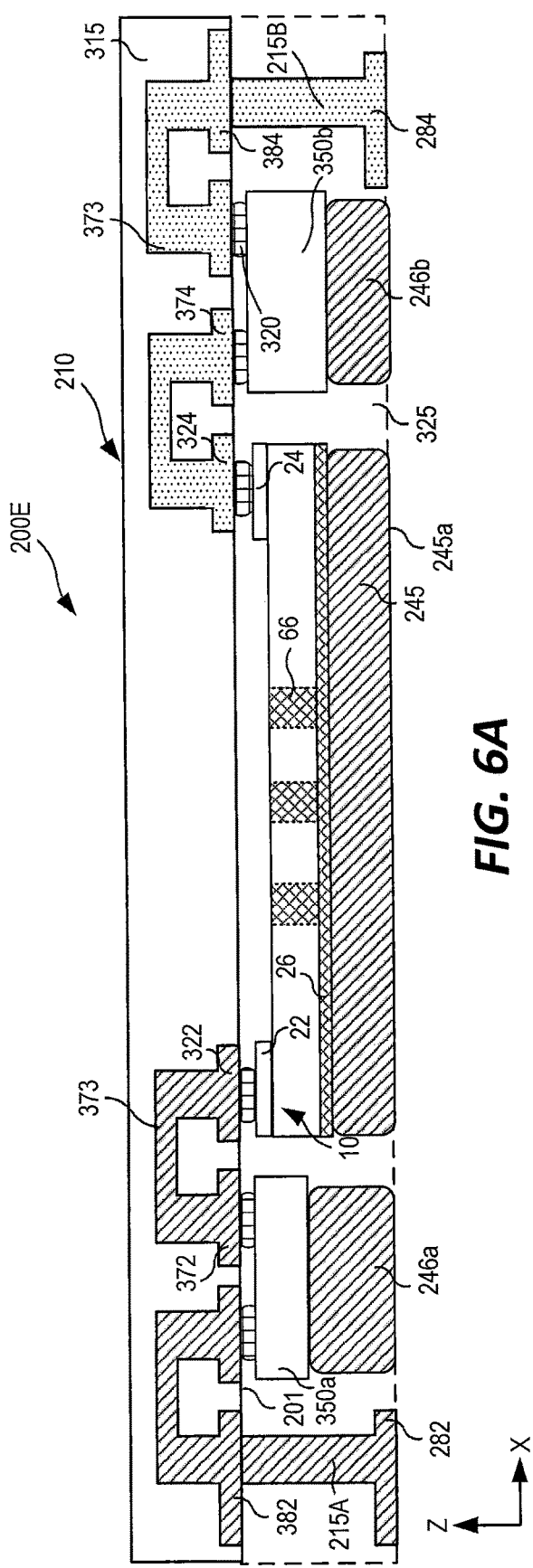
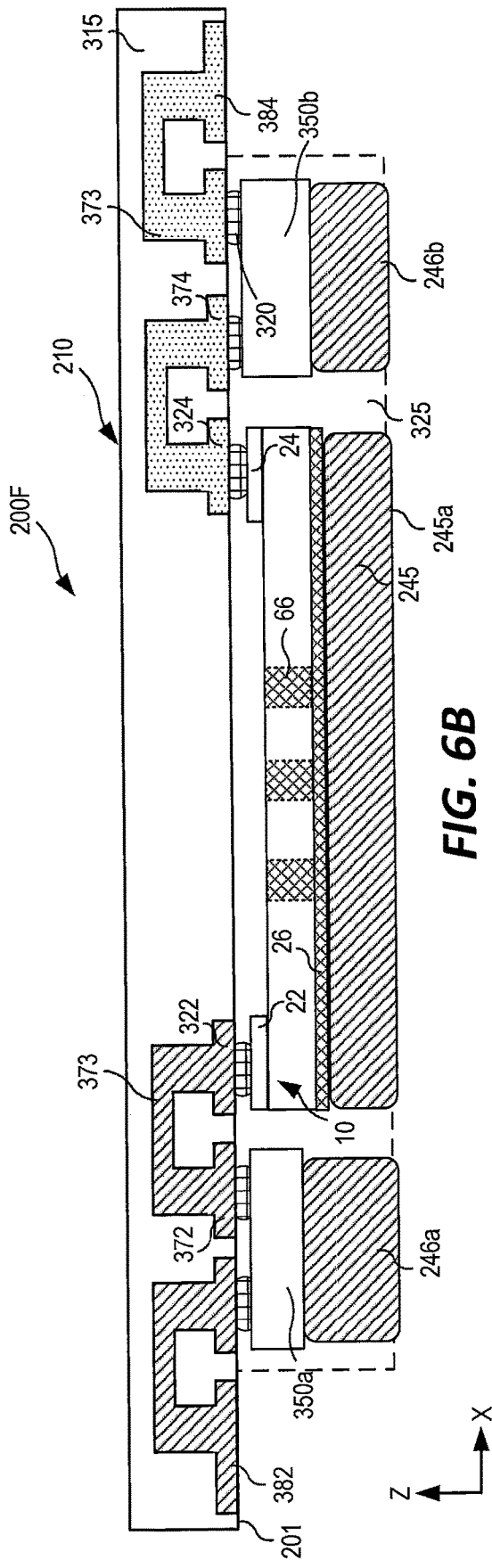
FIG. 6A
FIG. 6B

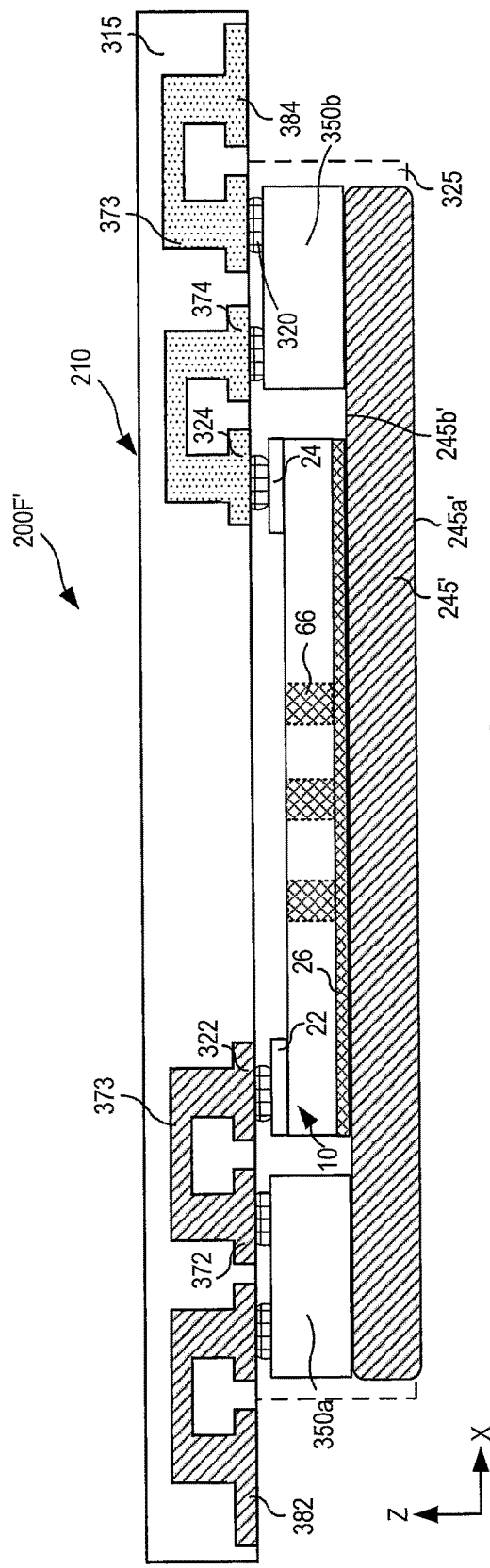
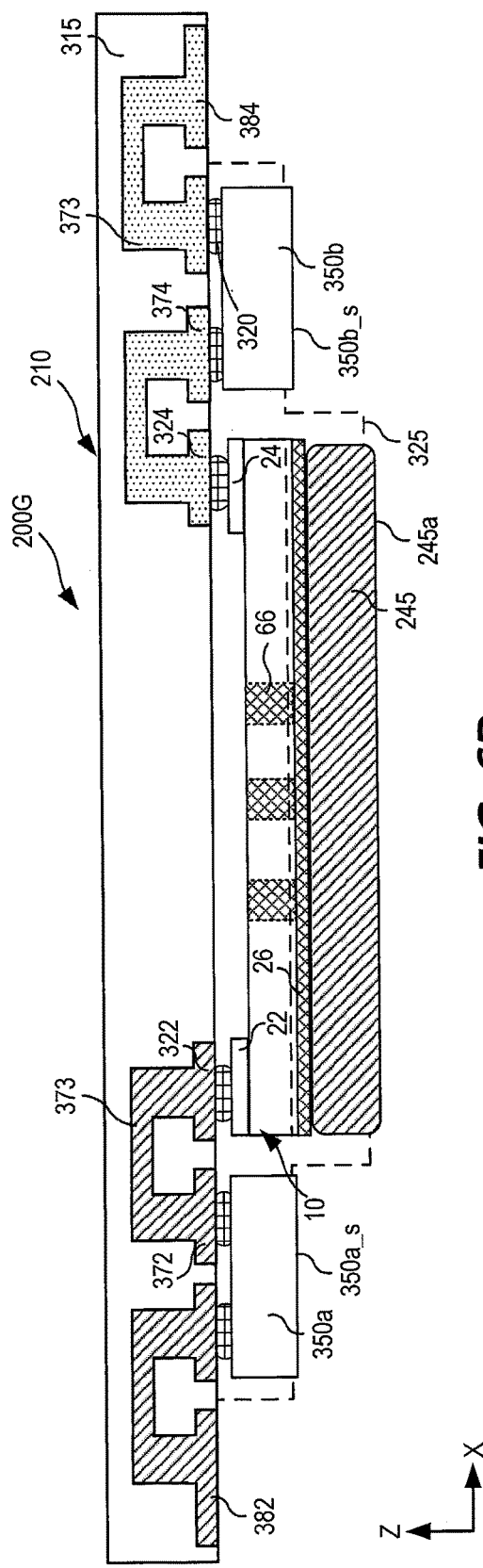
FIG. 6C
FIG. 6D

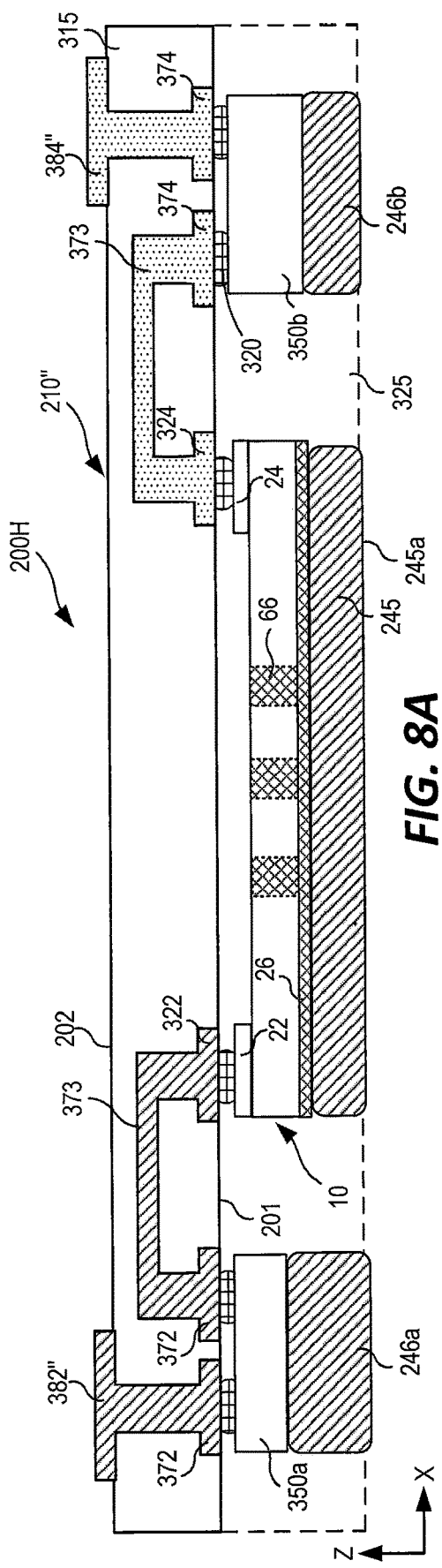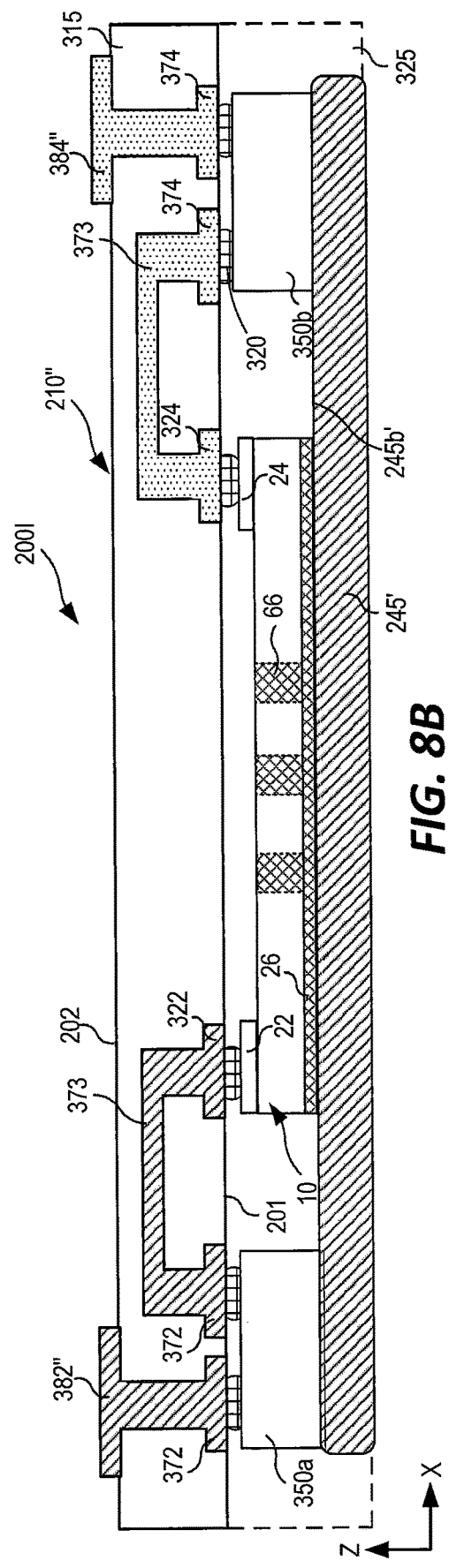

PACKAGING FOR RF TRANSISTOR AMPLIFIERS

FIELD

The present invention relates to microelectronic devices and, more particularly, to high power, high frequency transistor amplifiers.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, good linearity and handle high output power levels.

Most RF transistor amplifiers are implemented in silicon or wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier dies are used, they may be connected in series and/or in parallel.

RF transistor amplifiers often include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics. The RF transistor amplifier die(s) as well as the impedance matching and harmonic termination circuits may be enclosed in a package. Electrical leads may extend from the package that are used to electrically connect the RF transistor amplifier to external circuit elements such as input and output RF transmission lines and bias voltage sources.

As noted above, Group III nitride-based RF transistor amplifiers are often used in high power and/or high frequency applications. Typically, high levels of heat are generated within a Group III nitride-based RF transistor amplifier die during operation. If the RF transistor amplifier die becomes too hot, its performance (e.g., output power, efficiency, linearity, gain, etc.) may deteriorate and/or the RF transistor amplifier die may be damaged. As such, Group III nitride-based RF transistor amplifiers are typically mounted in packages that may be optimized for heat removal.

SUMMARY

Pursuant to embodiments of the present invention, RF transistor amplifiers are provided that provide an improved semiconductor package including fewer bond wires with improved connection options. RF transistor amplifiers according to some embodiments described herein may be cheaper and/or easier to manufacture and assemble while providing an improved performance.

According to some embodiments of the present invention, a radio frequency ("RF") transistor amplifier includes an RF transistor amplifier die having a semiconductor layer structure, an interconnect structure having first and second opposing sides, wherein the first side of the interconnect structure is adjacent a surface of the RF transistor amplifier die such that the interconnect structure and the RF transistor amplifier die are in a stacked arrangement, one or more circuit elements on the first and/or second side of the interconnect structure, and an encapsulating material on the RF transistor amplifier die and the interconnect structure.

In some embodiments, the one or more circuit elements are surface mounted on the first and/or second side of the interconnect structure.

In some embodiments, the RF transistor amplifier die further includes a gate terminal and a drain terminal on a first surface of the RF transistor amplifier die and a source terminal on a second surface of the RF transistor amplifier die.

In some embodiments, the RF transistor amplifier further includes a spacer that is on and electrically connected to the source terminal of the RF transistor amplifier die.

In some embodiments, the encapsulating material is also on the spacer.

In some embodiments, the RF transistor amplifier further includes a gate lead pad and a drain lead pad on the interconnect structure.

In some embodiments, the RF transistor amplifier further includes a first through via coupled to the gate lead pad and a second through via coupled to the drain lead pad.

In some embodiments, the interconnect structure comprises a Printed Circuit Board (PCB).

In some embodiments, the one or more circuit elements include circuitry comprising at least part of harmonic terminating circuitry and/or impedance matching circuitry.

In some embodiments, the semiconductor layer structure comprises a Group III nitride.

In some embodiments, the semiconductor layer structure further comprises a silicon and/or silicon carbide substrate.

In some embodiments, the semiconductor layer structure comprises a high electron mobility transistor (HEMT) or a laterally-diffused metal-oxide semiconductor (LDMOS) transistor.

In some embodiments, an operating frequency of the RF transistor amplifier is between 500 MHz and 75 GHz.

In some embodiments, the RF transistor amplifier further includes an auxiliary spacer on the one or more circuit elements.

In some embodiments, the encapsulating material exposes a surface of the auxiliary spacer.

In some embodiments, the encapsulating material exposes a surface of the one or more circuit elements.

According to some embodiments of the present invention, an RF transistor amplifier package includes an RF transistor amplifier die having a first major surface and a second major surface on an opposite side of the RF transistor amplifier die from the first major surface, the RF transistor amplifier die comprising a gate terminal and a drain terminal on the first major surface and a source terminal on the second major surface, an interconnect structure on the first major surface of the RF transistor amplifier die, the interconnect structure comprising a gate lead pad electrically coupled to the gate terminal and a drain lead pad electrically coupled to the drain terminal, an input lead extending from outside the RF transistor amplifier package and electrically coupled to the gate lead pad, and an output lead extending from outside the RF transistor amplifier package and electrically coupled to the drain lead pad.

In some embodiments, the interconnect structure further includes a first side adjacent the first major surface of the RF transistor amplifier die and a second side opposite the first side, and one or more circuit elements that are coupled between the gate terminal and the input lead and/or between the drain terminal and the output lead.

In some embodiments, the one or more circuit elements are mounted on the first side and/or the second side of the interconnect structure.

In some embodiments, the input lead and/or the output lead are coupled to the first side and/or the second side of the interconnect structure.

In some embodiments, the RF transistor amplifier package further includes an auxiliary spacer that is on the one or more circuit elements.

In some embodiments, the RF transistor amplifier package further includes a spacer that is on and electrically connected to the source terminal of the RF transistor amplifier die.

In some embodiments, the RF transistor amplifier package further includes a carrier substrate on the second major surface of the RF transistor amplifier die, with the spacer therebetween.

In some embodiments, the spacer is electrically connected to the carrier substrate.

In some embodiments, the RF transistor amplifier package further includes sidewalls and a lid, wherein the carrier substrate, the sidewalls, and the lid define an internal cavity, and the RF transistor amplifier die is within the internal cavity.

In some embodiments, the RF transistor amplifier package further includes an overmold material on the interconnect structure and RF transistor amplifier die.

In some embodiments, the interconnect structure comprises an input matching circuit and/or an output matching circuit.

In some embodiments, the RF transistor amplifier die is a Group III nitride-based RF transistor amplifier die.

In some embodiments, the RF transistor amplifier die comprises a high electron mobility transistor (HEMT) or a laterally-diffused metal-oxide semiconductor (LDMOS) transistor.

In some embodiments, an operating frequency of the RF transistor amplifier package is in the R-band, S-band, X-band, Ku-band, K-band, Ka-band, and/or V-band.

In some embodiments, the input lead is electrically coupled to the gate lead pad by a through via in an encapsulating material on the interconnect structure.

According to some embodiments of the present invention, a transistor amplifier package includes a group III-nitride based amplifier die comprising a first major surface and a second major surface on an opposite side of the amplifier die from the first major surface, the amplifier die comprising a gate terminal and a drain terminal on the first major surface and a source terminal on the second major surface, and an interconnect structure on the first major surface of the amplifier die and electrically coupled to the gate terminal and drain terminal, wherein the interconnect structure comprises one or more circuit elements that are coupled between the gate terminal and a first lead of the transistor amplifier package and/or between the drain terminal and a second lead of the transistor amplifier package. The interconnect structure has a first side and a second side that is on an opposite side of the interconnect structure from the first side, wherein the first side of the interconnect structure is adjacent the first major surface of the amplifier die.

In some embodiments, the one or more circuit elements are mounted on the first side and/or second side of the interconnect structure.

In some embodiments, the first lead and the second lead are coupled to the first side of the interconnect structure.

In some embodiments, the first lead and the second lead are coupled to the second side of the interconnect structure.

In some embodiments, the interconnect structure comprises a first interconnection pad and a second interconnection pad on the first side of the interconnect structure, the first interconnection pad is electrically coupled to the gate terminal of the amplifier die, and the second interconnection pad is electrically coupled to the drain terminal of the amplifier die.

In some embodiments, the one or more circuit elements are mounted on the first and/or the second side of the interconnect structure.

In some embodiments, the transistor amplifier package further includes a spacer that is on and electrically connected to the source terminal of the amplifier die.

In some embodiments, the transistor amplifier package further includes an encapsulating material on the amplifier die, the interconnect structure, and the spacer.

In some embodiments, the transistor amplifier package further includes an auxiliary spacer on at least one of the one or more circuit elements.

In some embodiments, the encapsulating material exposes a surface of the auxiliary spacer.

In some embodiments, the encapsulating material exposes a surface of the one or more circuit elements.

In some embodiments, the interconnect structure comprises a gate lead pad and a drain lead pad.

In some embodiments, the transistor amplifier package further includes a gate connection pad coupled to the gate lead pad by a first through via in the encapsulating material; and a drain connection pad coupled to the drain lead pad by a second through via in the encapsulating material. The first lead is coupled to the gate connection pad and the second lead is coupled to the drain connection pad.

In some embodiments, the gate connection pad, the drain connection pad, and a bottom surface of the spacer are coplanar.

In some embodiments, the one or more circuit elements include circuitry comprising at least part of harmonic terminating circuitry and/or impedance matching circuitry.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 6A to 6D are schematic cross-sectional views of RF transistor amplifiers according to additional embodiments of the present invention.

FIGS. 8A to 8C are schematic cross-sectional views of RF transistor amplifiers according to additional embodiments of the present invention.

DETAILED DESCRIPTION

In the following detailed description, numerous specific details are set forth to provide a thorough understanding of embodiments of the present disclosure. However, it will be understood by those skilled in the art that the present disclosure may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

Figure 1A:
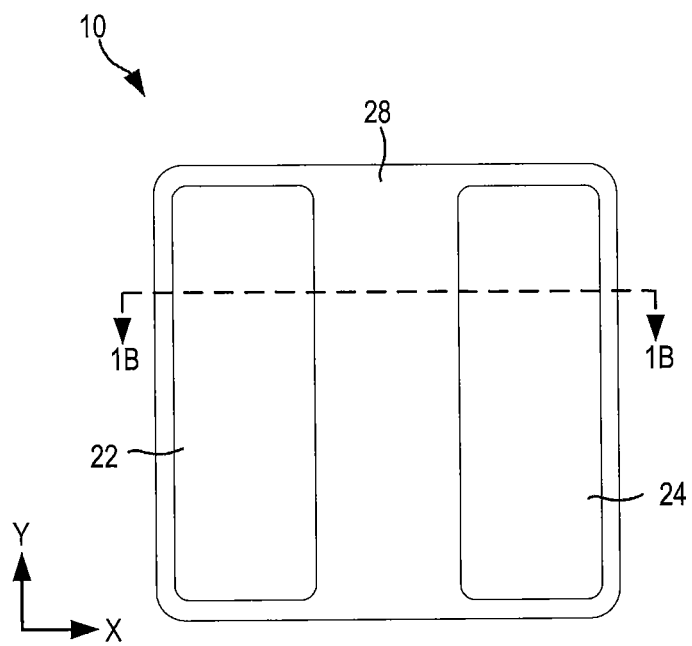
FIG. 1A is a schematic plan view of a conventional Group III nitride-based RF transistor amplifier die.
Figure 1B:
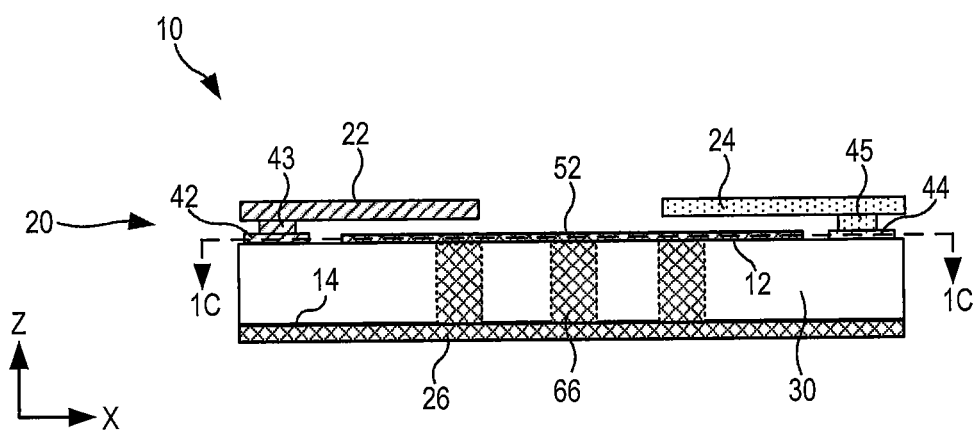
FIG. 1B is a schematic cross-sectional view taken along line 1B-1B of FIG. 1A.
Figure 1C:
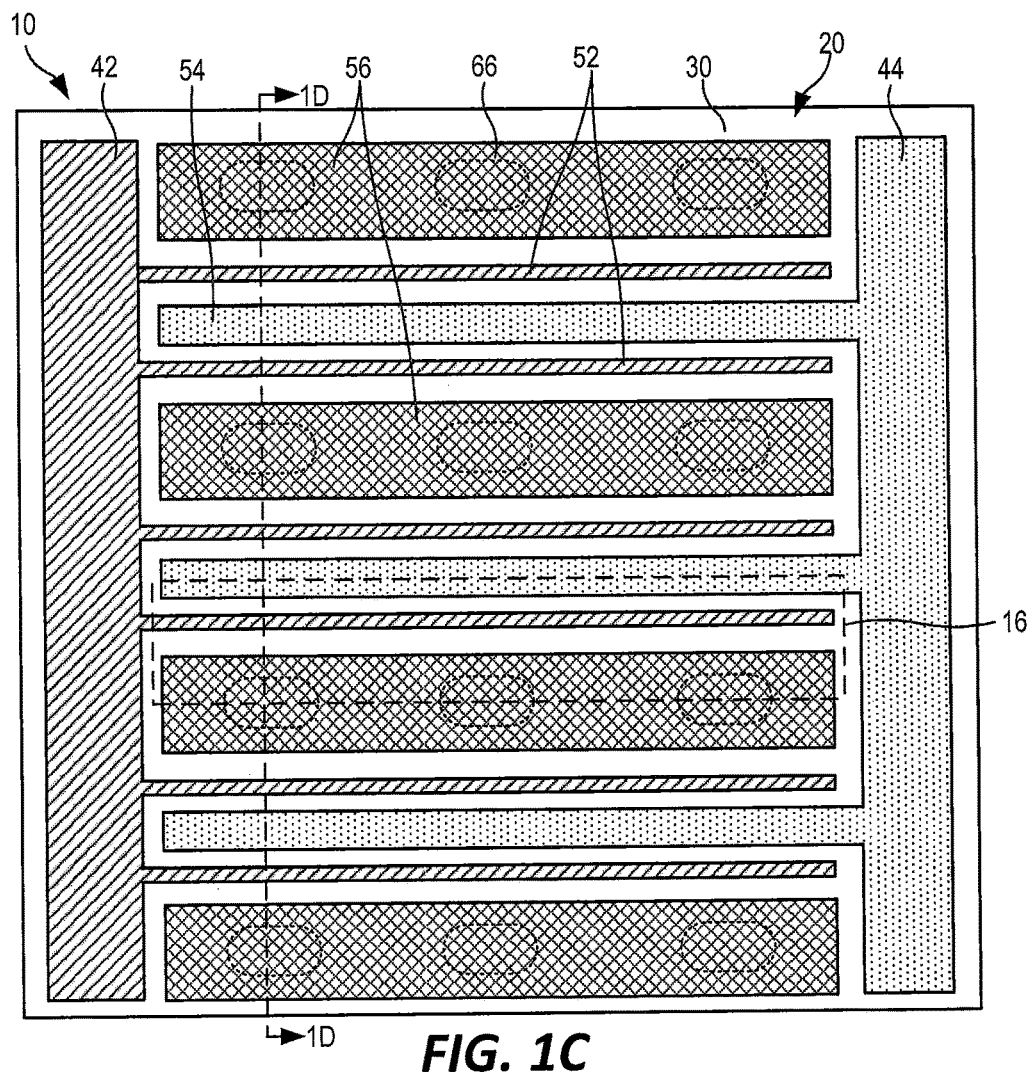
FIG. 1C is a schematic cross-sectional view taken along line 1C-1C of FIG. 1B that illustrates the metallization layers that are formed directly on the top surface of the semiconductor layer structure.
Figure 1D:
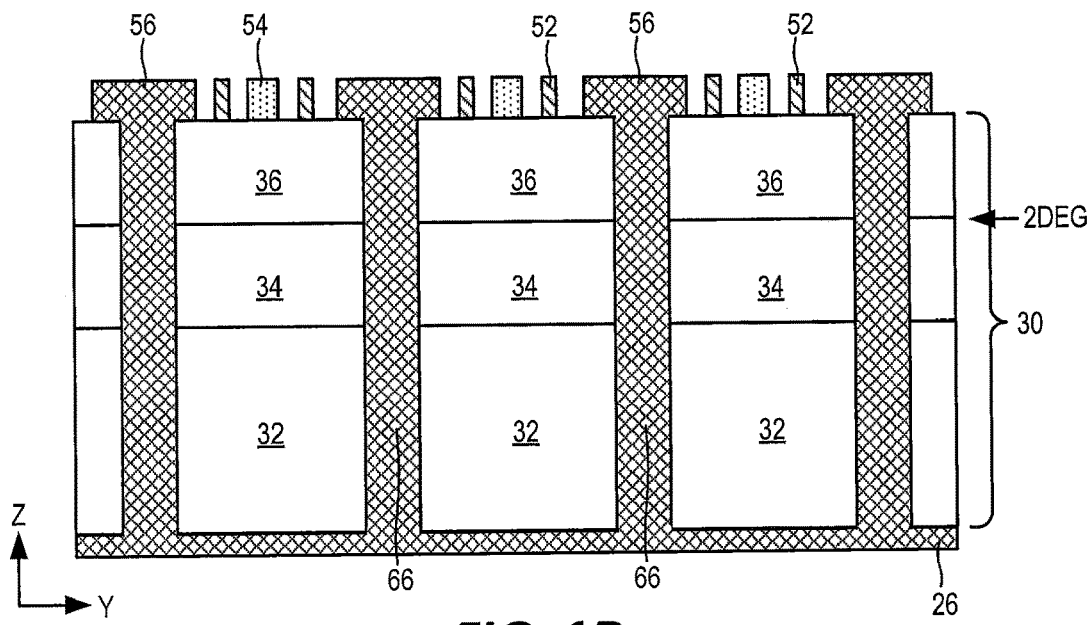
FIG. 1D is a schematic cross-sectional view taken along line 1D-1D of FIG. 1C.
Figure 1E:
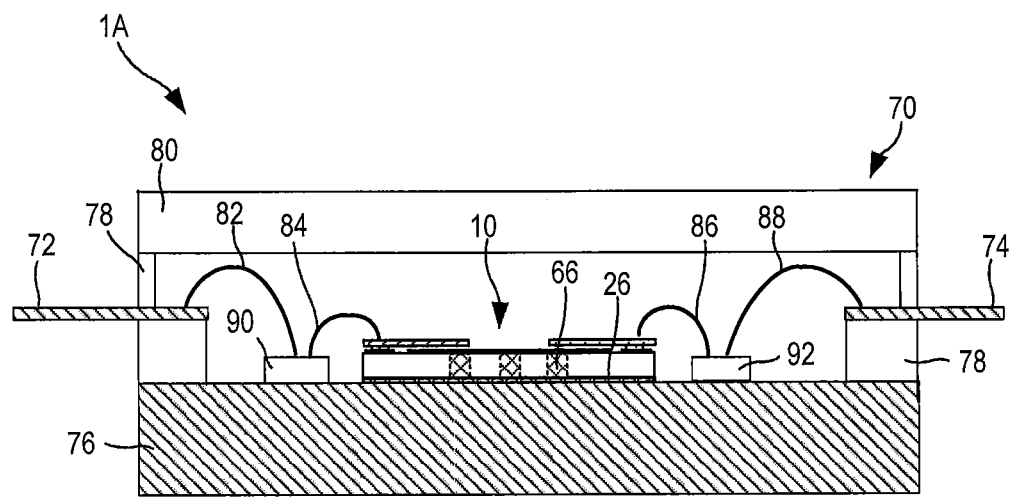
FIG. 1E is a schematic cross-sectional view of the Group III nitride-based RF transistor amplifier die of FIGS. 1A-1D packaged in an open cavity package.
Figure 1F:
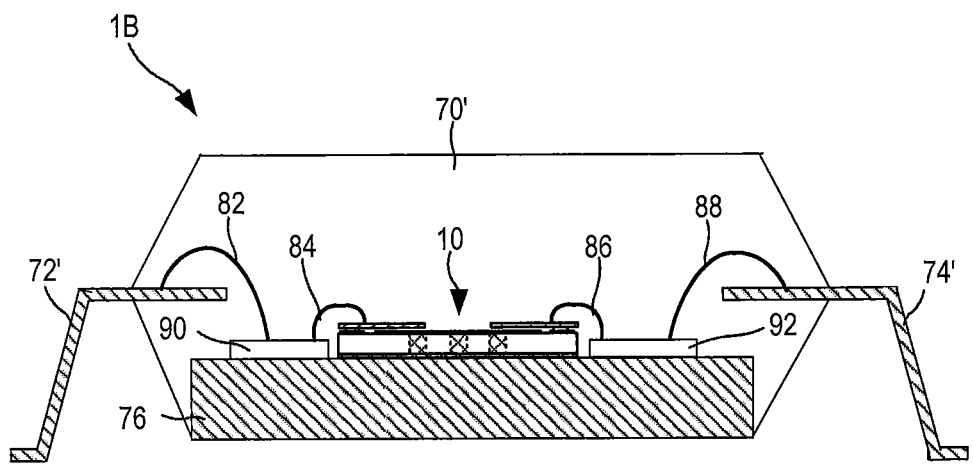
FIG. 1F is a schematic cross-sectional view of the Group III nitride-based RF transistor amplifier die of FIGS. 1A-1D packaged in an overmold package.

FIGS. 1A through 1D are various views that schematically illustrate a conventional Group III nitride-based RF transistor amplifier die 10. In particular, FIG. 1A is a schematic plan view of the Group III nitride-based RF transistor amplifier die 10, and FIG. 1B is a schematic cross-sectional view of the RF transistor amplifier die 10 taken along line 1B-1B of FIG. 1A. FIG. 1C is a schematic cross-sectional view taken along line 1C-1C of FIG. 1B that shows the metallization on the top surface of the semiconductor layer structure of the RF transistor amplifier die 10, and FIG. 1D is a cross-sectional view of the RF transistor amplifier die 10 taken along line 1D-1D of FIG. 1C. FIGS. 1E and 1F are schematic cross-sectional views illustrating two example ways that the RF transistor amplifier die 10 of FIGS. 1A-1D may be packaged to provide packaged RF transistor amplifiers 1A and 1B, respectively. It will be appreciated that FIGS. 1A-1F (and many of the other figures of the present application) are highly simplified diagrams, and that actual RF transistor amplifiers may include many more unit cells and various circuitry and elements that are not shown in the simplified figures herein.

As shown in FIG. 1A, the RF transistor amplifier die 10 includes a gate terminal 22 and a drain terminal 24 that are exposed on the top side of the RF transistor amplifier die 10. A first circuit element (not shown) may be connected to the gate terminal 22 by, for example, bond wires (not shown) and a second circuit element (not shown) may be connected to the drain terminal 24 by, for example, bond wires (not shown). The first circuit element may, for example, pass an input RF signal that is to be amplified to the RF transistor amplifier die 10 and the second circuit element may receive an amplified RF signal that is output by the RF transistor amplifier die 10. A protective insulating layer or pattern 28 may cover the rest of the top surface of the RF transistor amplifier die 10.

As shown in FIGS. 1B-1D, the RF transistor amplifier die 10 further includes a semiconductor layer structure 3d, a top-side metallization structure 20 and a back side metallization structure that acts as a source terminal 26 for the RF transistor amplifier die 10.

The semiconductor layer structure 30 includes a plurality of semiconductor layers. The RF transistor amplifier die 10 may be a HEMT-based RF transistor amplifier die, and hence the semiconductor layer structure 30 may include at least a channel layer and a barrier layer. Referring to FIG. 1D, in the depicted example, a total of three layers are shown, namely a semiconductor channel layer 34 and a semiconductor barrier layer 36 that are sequentially formed on a growth substrate 32, which may be a semiconductor or insulating substrate (such as a SiC or sapphire substrate). The growth substrate 32, even if formed of a non-semiconductor material, is considered to be part of the semiconductor layer structure 30.

Suitable structures for Group III-nitride-based HEMT devices that may utilize embodiments of the present invention are described, for example, in commonly assigned U.S.

Patent Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Patent Publication No. 2002/0167023A1 for "Group-III Nitride Based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

The growth substrate 32 may be a semi-insulating silicon carbide (SiC) substrate that may be, for example, the 4H polytype of silicon carbide. Other silicon carbide candidate polytypes may include the 3C, 6H, and 15R polytypes. The growth substrate 32 may be a High Purity Semi-Insulating (HPSI) substrate, available from Cree, Inc. The term "semi-insulating" is used descriptively herein, rather than in an absolute sense.

In some embodiments of the present invention, the SiC bulk crystal of the growth substrate 32 may have a resistivity equal to or higher than about $1 \times 10^5$ ohm-cm at room temperature. Exemplary SiC substrates that may be used in some embodiments of the present invention are manufactured by, for example, Cree, Inc., of Durham, N.C., the assignee of the present invention, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although SiC may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The growth substrate 32 may be a SiC wafer, and the RF transistor amplifier die 10 may be formed, at least in part, via wafer-level processing, and the wafer may then be diced to provide a plurality of individual RF transistor amplifiers dies 10.

SiC has a much closer crystal lattice match to Group III nitrides than does sapphire ($Al_2O_3$) or silicon, which are very common substrate materials for Group III nitride devices. The closer lattice match of SiC may result in Group III nitride films of higher quality than those generally available on sapphire or silicon. SiC also has a very high thermal conductivity so that the total output power of Group III nitride devices on SiC is, typically, not as limited by thermal dissipation of the substrate as in the case of the same devices formed on sapphire. Also, the availability of semi-insulating SiC substrates may provide for device isolation and reduced parasitic capacitance.

Optional buffer, nucleation, and/or transition layers (not shown) may be provided on the growth substrate 32 beneath the channel layer 34. For example, an AlN buffer layer may be included to provide an appropriate crystal structure transition between an SiC growth substrate 32 and the remainder of the semiconductor layer structure 30. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein.

The channel layer 34 and the barrier layer 36 may each be formed by epitaxial growth in some embodiments. Techniques for epitaxial growth of Group III nitrides have been described in, for example, U.S. Pat. Nos. 5,210,051, 5,393,993, and 5,523,589, the disclosures of which are also incorporated by reference herein in their entireties. The channel layer 34 may have a bandgap that is less than the bandgap of the barrier layer 36 and the channel layer 34 may also have a larger electron affinity than the barrier layer 36. The channel layer 34 and the barrier layer 36 may include Group III-nitride based materials.

In some embodiments, the channel layer 34 is a Group III nitride material, such as $Al_xGa_{1-x}N$ where $0 \leq x < 1$, provided that the energy of the conduction band edge of the channel layer 34 is less than the energy of the conduction band edge of the barrier layer 36 at the interface between the channel and barrier layers 34, 36. In certain embodiments of the present invention, x=0, indicating that the channel layer 34 is gallium nitride ("GaN"). The channel layer 34 may also be other Group III nitrides such as InGaN, AlInGaN, or the like. The channel layer 34 may be undoped or unintentionally doped and may be grown to a thickness of, for example, greater than about 2 nm. The channel layer 34 may also be a multi-layer structure, such as a superlattice or combinations of GaN, AlGaN or the like.

The channel layer 34 may have a bandgap that is less than the bandgap of at least a portion of the barrier layer 36, and the channel layer 34 may also have a larger electron affinity than the barrier layer 36. In certain embodiments, the barrier layer 36 is AlN, AlInN, AlGaN, or AlInGaN with a thickness of between about 0.1 nm and about 10 nm or more. In particular embodiments, the barrier layer 36 is thick enough and has a high enough Al composition and doping to induce a significant carrier concentration at the interface between the channel layer 34 and the barrier layer 36.

The barrier layer 36 may be a Group III nitride and may have a bandgap larger than that of the channel layer 34 and a smaller electron affinity than the channel layer 34. Accordingly, in certain embodiments of the present invention, the barrier layer 36 may include AlGaN, AlInGaN and/or AlN or combinations of layers thereof. The barrier layer 36 may, for example, be from about 0.1 nm to about 30 nm thick. In certain embodiments, the barrier layer 36 is undoped or doped with an n-type dopant to a concentration less than about $10^{19}$ $cm^{-3}$. In some embodiments of the present invention, the barrier layer 36 is $Al_xGa_{1-x}N$ where $0 < x < 1$. In particular embodiments, the aluminum concentration is about 25%. However, in other embodiments of the present invention, the barrier layer 36 comprises AlGaN with an aluminum concentration of between about 5% and about 100%. In specific embodiments of the present invention, the aluminum concentration is greater than about 10%.

Due to the difference in bandgap between the barrier layer 36 and the channel layer 34 and piezoelectric effects at the interface between the barrier layer 36 and the channel layer 34, a two dimensional electron gas (2DEG) is induced in the channel layer 34 at a junction between the channel layer 34 and the barrier layer 36. The 2DEG acts as a highly conductive layer that allows conduction between the source region of each unit cell transistor 16 (see FIG. 1C) and its associated drain region, where the source region is the portion of the semiconductor layer structure 30 that is directly underneath the source finger 56 and the drain region is the portion of the semiconductor layer structure 30 that is directly underneath the corresponding drain finger 54.

While semiconductor layer structure 30 is shown with channel layer 34 and barrier layer 36 for purposes of illustration, semiconductor layer structure 30 may include additional layers/structures/elements such as a buffer and/or nucleation layer(s) between channel layer 34 and substrate 32, and/or a cap layer on barrier layer 36. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,548,112, and 7,709,269, the disclosures of which are hereby incorporated herein in their entirety by reference. For example, an AlN buffer layer may be formed on the upper surface of the substrate 32 to provide an appropriate crystal structure transition between the growth substrate 32 and the remainder of the RF transistor amplifier die 10. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

Referring again to FIG. 1B, the semiconductor layer structure 30 has a top side 12 and a bottom side 14. The top-side metallization structure 20 is formed on the top side 12 of the semiconductor layer structure 30 and the source terminal 26 is formed on the bottom side 14 of the semiconductor layer structure 30. The top-side metallization structure 20 includes, among other things, a conductive (typically metal) gate manifold 42 and a conductive (typically metal) drain manifold 44, conductive gate and drain vias 43, 45, conductive gate and drain terminals 22, 24, and gate, drain and source fingers 52, 54, 56 (described below). The gate manifold 42 is electrically connected to the gate terminal 22 through the gate vias 43, and the drain manifold 44 is electrically connected to the drain terminal 24 through the conductive drain vias 45. The gate and drain vias 43, 45 may comprise, for example, metal-plated vias or metal pillars that are formed through a dielectric material such as silicon oxide, silicon nitride, a dielectric underfill material or the like. In some embodiments, the gate and drain vias 43, 45 may be omitted. In such embodiments, the gate manifold 42 may be formed integrally with the gate terminal 22 and/or the drain manifold 44 may be formed integrally with the drain terminal 24.

As shown in FIG. 1C, the RF transistor amplifier die 10 comprises a plurality of unit cell transistors 16, one of which is indicated by the dashed box in FIG. 1C. Each unit cell transistor 16 includes a gate finger 52, a drain finger 54, and a source finger 56. The gate, drain and source fingers 52, 54, 56 are formed on the upper surface of the semiconductor layer structure 30 and comprise part of the top-side metallization structure 20. The top-side metallization structure 20 further includes the gate manifold 42 and the drain manifold 44. The gate fingers 52 are electrically connected to the gate manifold 42, and the drain fingers 54 are electrically connected to the drain manifold 44. The source fingers 56 are electrically connected to the source terminal 26 (FIG. 1B) via a plurality of conductive source vias 66 that extend through the semiconductor layer structure 30. The conductive source vias 66 may comprise metal-plated vias that extend completely through the semiconductor layer structure 30.

FIG. 1E is a schematic side view of a packaged Group III nitride-based RF transistor amplifier 1A that includes the RF transistor amplifier die 10 of FIGS. 1A-1D. As shown in FIG. 1E, packaged RF transistor amplifier 1A includes the RF transistor amplifier die 10 and an open cavity package 70. The package 70 includes metal gate leads 72, metal drain leads 74, a metal submount 76, ceramic sidewalls 78, and a ceramic lid 80.

The RF transistor amplifier die 10 is mounted on the upper surface of the metal submount 76 (which may be a metal block or flange) in a cavity defined by the metal submount 76, the ceramic sidewalls 78 and the ceramic lid 80. The source terminal 26 of the RF transistor amplifier die 10 may be connected to the metal submount 76 (e.g., via die attach material). The metal submount 76 may provide the electrical connection to the source terminal 26 and may also serve as a heat dissipation structure that dissipates heat that is generated in the RF transistor amplifier die 10. The heat is primarily generated in the upper portion of the RF transistor amplifier die 10 where relatively high current densities are generated in, for example, the channel regions of the unit cell transistors 16. This heat may be transferred though the source vias 66 and the semiconductor layer structure 30 to the source terminal 26 and then to the metal submount 76.

Input matching circuits 90 and/or output matching circuits 92 may also be mounted within the package 70. The matching circuits 90, 92 may be impedance matching circuits that match the impedance of the fundamental component of RF signals that are input to or output from the RF transistor amplifier 1A to the impedance at the input or output of the RF transistor amplifier die 10, respectively, and/or harmonic termination circuits that are configured to ground harmonics of the fundamental RF signal that may be present at the input or output of the RF transistor amplifier die 10. More than one input matching circuit 90 and/or output matching circuit 92 may be provided. As schematically shown in FIG. 1E, the input and output matching circuits 90, 92 may be mounted on the metal submount 76. The gate lead 72 may be connected to the input matching circuit 90 by one or more first bond wires 82, and the input matching circuit 90 may be connected to the gate terminal 22 of RF transistor amplifier die 10 by one or more second bond wires 84. Similarly, the drain lead 74 may be connected to the output matching circuit 92 by one or more fourth bond wires 88, and the output matching circuit 92 may be connected to the drain terminal 24 of RF transistor amplifier die 10 by one or more third bond wires 86. The bond wires 82, 84, 86, 88 may form part of the input and/or output matching circuits. The gate lead 72 and the drain lead 74 may extend through the ceramic sidewalls 78. The interior of the package 70 may comprise an air-filled cavity.

FIG. 1F is a schematic side view of another conventional packaged Group III nitride-based RF transistor amplifier 1B. RF transistor amplifier 1B differs from RF transistor amplifier 1A in that it includes a different package 70'. The package 70' includes a metal submount 76 (which acts as a metal heat sink and can be implemented as a metal slug), as well as gate and drain leads 72', 74'. RF transistor amplifier 1B also includes a plastic overmold 78' that at least partially surrounds the RF transistor amplifier die 10, the leads 72', 74' and the metal submount 76. Other components of RF transistor amplifier 1B may be the same as the like-numbered components of RF transistor amplifier 1A and hence further description thereof will be omitted.

As described above, conventional Group III nitride-based packaged RF transistor amplifiers, such as the packaged RF transistor amplifiers 1A and 1B of FIGS. 1E and 1F, typically implement the gate and drain terminals on the upper side of the semiconductor layer structure and the source terminal on the lower side of the semiconductor layer structure. Conductive source vias extend through the semiconductor layer structure to electrically connect the source fingers in the upper portion of the semiconductor layer structure to the source terminal. These conventional RF transistor amplifiers also typically use bond wires to connect the RF transistor amplifier die to other elements of the devices such as matching circuits and/or input/output leads. These bond wires have inherent inductance that may supply some of the inductance of the impedance matching and/or harmonic termination circuits. The amount of inductance provided by the bond wires may be varied by changing the length and/or the cross-sectional area (e.g., the diameter) of the bond wires so that the bond wires provide a desired amount of inductance. Unfortunately, as applications move to higher frequencies, the inductance of the bond wires may exceed a desired amount of inductance for the impedance matching and/or harmonic termination circuits. When this occurs, bond wires that are very short and/or that have large cross-sectional areas may be used to decrease the inductance. Very short bond wires, however, may be difficult to solder in place, which may increase manufacturing costs, and/or may result in higher device failure rates. Bond wires having large cross-sectional areas may require larger gate and drain terminals on the RF transistor amplifier die, which may result in an undesirable increase in the overall size of the RF transistor amplifier die. Moreover, in some higher frequency applications, even very short bond wires having large cross-sectional areas may have too much inductance such that the matching networks cannot, for example, properly terminate the second or third order harmonics. While the RF transistor amplifiers may be implemented as monolithic microwave integrated circuit ("MMIC") devices in order to avoid the problem of too much inductance in the bond wires, MMIC RF amplifiers are more expensive to fabricate and can only be used in the frequency range of the matching circuits, reducing flexibility.

Moreover, wire bonding equipment that is typically used for high volume manufacturing may have a tolerance of +/−1 mil, meaning that the length of any particular bond wire may vary by as much 2 mils from a desired length. For high frequency applications, the variation in inductance associated with 2 mils of a bond wire may be significant, and hence the performance of the matching circuits may be degraded if the bond wires are 1-2 mils too short or long from a desired nominal length.

Pursuant to embodiments of the present invention, Group III nitride-based RF transistor amplifiers are provided that include RF transistor amplifier dies that incorporate packaging and/or mounting options that may not include bond wires for the gate and/or drain connections, which may reduce an amount of inductance present in the circuit and the variation in inductance that may arise when bond wire connections are used. In some embodiments, the RF transistor amplifiers may be mounted in a flip chip arrangement in which the RF transistor amplifier die may be mounted on another substrate, such as an interconnect structure, in a stacked arrangement. The interconnect structure may include, for example, other circuit elements of the RF transistor amplifier such as, for example, impedance matching and/or harmonic termination circuitry.

Embodiments of the present invention will now be discussed in further detail with reference to the figures.

Figure 2A:
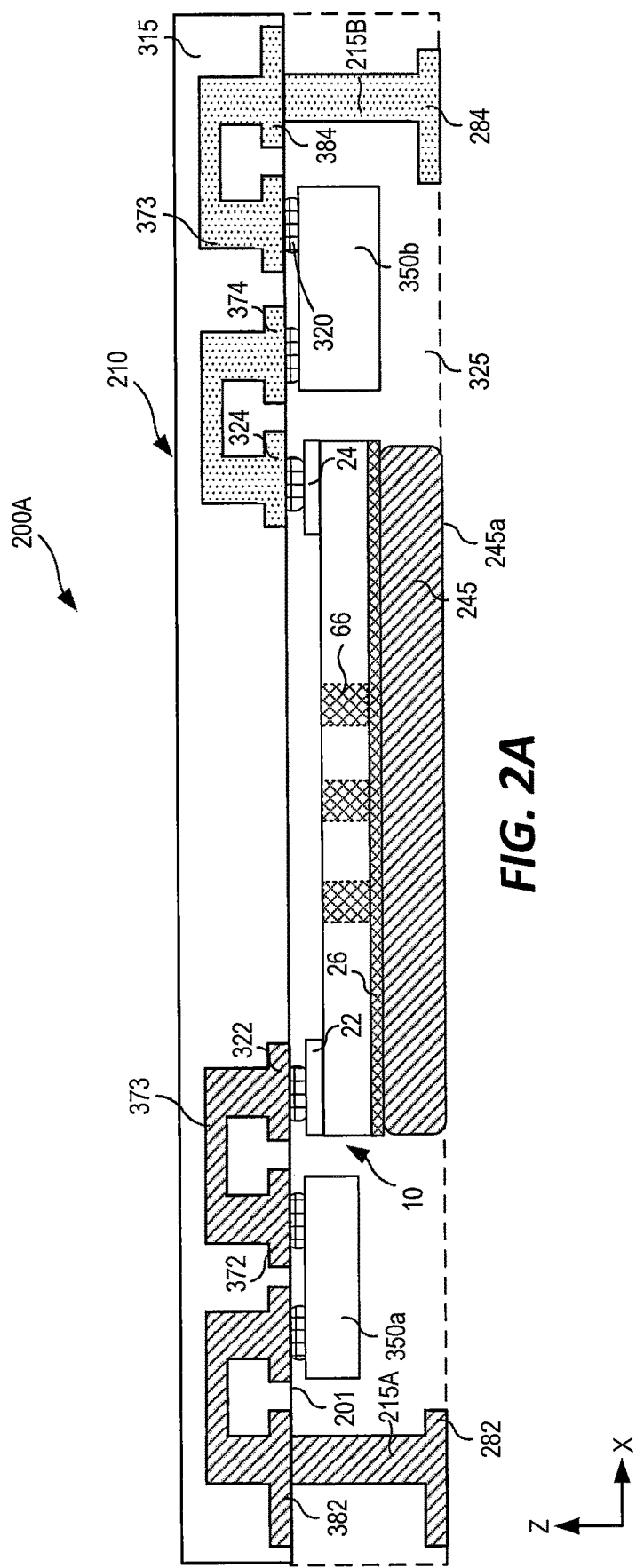
FIG. 2A is a schematic cross-sectional views of an embodiment of an RF transistor amplifier, according to some embodiments of the present invention.
Figure 2B:
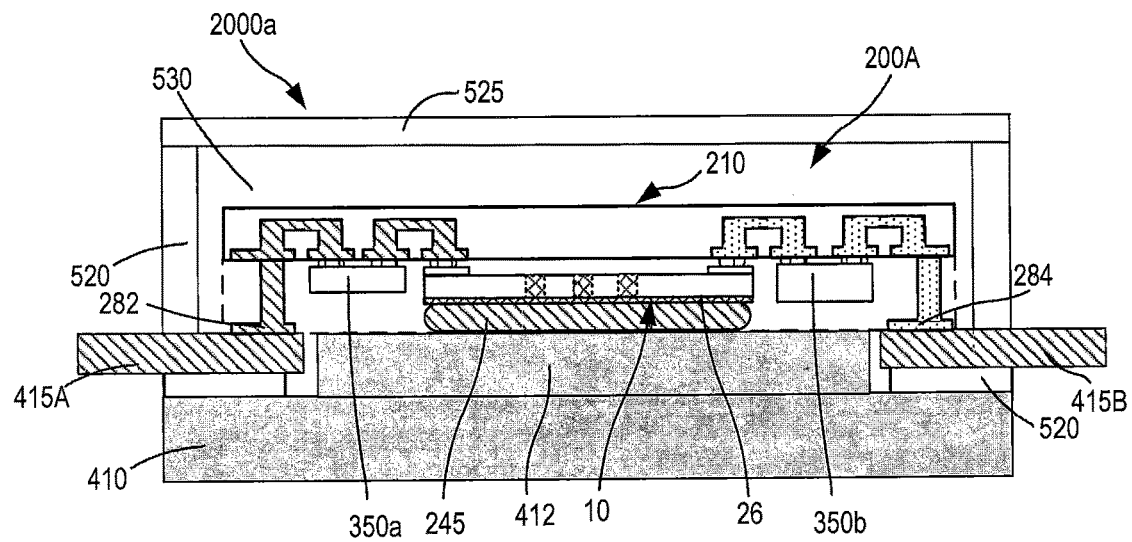
FIGS. 2B and 2C are schematic cross-sectional views of various packaging options of the RF transistor amplifier of FIG. 2A, according to some embodiments of the present invention.
Figure 2C:
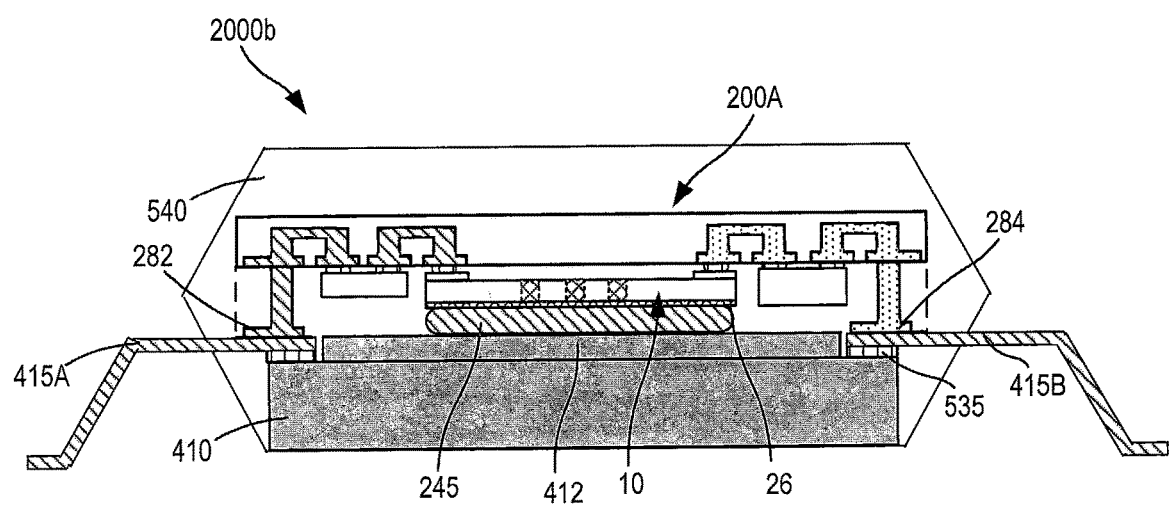

FIG. 2A is a schematic cross-sectional view of an RF transistor amplifier 200A according to some embodiments of the present invention. FIGS. 2B and 2C are schematic cross-sectional views of various packaging options 2000a, 2000b of the RF transistor amplifier 200A of FIG. 2A, according to some embodiments of the present invention.

Referring to FIG. 2A, an RF transistor amplifier die 10, such as the die illustrated in FIGS. 1A through 1D, may be coupled to an interconnect structure 210. The interconnect structure 210 may be coupled to the gate terminal 22 and the drain terminal 24 of the RF transistor amplifier die 10. Though FIG. 2A illustrates that the interconnect structure 210 is coupled directly to the RF transistor amplifier die 10, it will be understood that other connection types are possible. For example, an interposer, a fan-in structure, a fan-out structure, or other type of coupling element may be coupled between the interconnect structure 210 and the RF transistor amplifier die 10.

The interconnect structure 210 may have an exposed first interconnection pad 322 and second interconnection pad 324 that may be configured to be coupled to the gate terminal 22 and the drain terminal 24 of the RF transistor amplifier die 10, respectively. In some embodiments, a bonding element (e.g., solder balls and/or bumps 320) may be used to respectively couple the first and second interconnection pads 322, 324 to the gate terminal 22 and the drain terminal 24. Though illustrated as a single pad, in some embodiments, one or more of the first and/or second interconnection pads 322, 324 may include a plurality of pads.

The interconnect structure 210 may be coupled to the RF transistor amplifier die 10 on a first side 201 of the interconnect structure 210. In addition, a gate lead pad 382 and a drain lead pad 384 may be exposed on the first side 201 of the interconnect structure 210. The gate lead pad 382 and the drain lead pad 384 may be configured to be respectively electrically coupled to the gate terminal 22 and the drain terminal 24 of the RF transistor amplifier die 10 through respective conductive paths in the interconnect structure 210.

The first and second interconnection pads 322, 324 may be coupled to one or more conductive patterns 373 within the interconnect structure 210. The conductive patterns 373 may provide various routing and/or circuitry within the interconnect structure 210. The conductive patterns 373 may be encased in an isolation material 315. In some embodiments, the isolation material 315 may include, for example, silicon oxide, silicon nitride, an oxide of the conductive patterns 373, a polymer, a molding compound, or a combination thereof. In some embodiments, the interconnect structure 210 may be formed as a printed circuit board (PCB). In a PCB embodiment, the isolation material 315 may be the substrate(s) of the PCB, and the conductive patterns 373 may be traces, pads and/or and conductive vias that are formed within/through the substrate(s). Though illustrated as being formed within the isolation material 315, it will be understood that in some embodiments, the conductive patterns 373 may be formed on a surface of the interconnect structure 210 (e.g., as a trace and/or pad on a PCB).

In some embodiments, the conductive patterns 373 may connect the first interconnection pad 322 to one or more first surface connection pads 372 and the gate lead pad 382. In some embodiments, the first surface connection pads 372 may be exposed on the first side 201 of the interconnect structure 210. In some embodiments, a first circuit element 350a may be coupled to one or more of the first surface connection pads 372 so as to be electrically coupled between the gate lead pad 382 and the first interconnection pad 322. In some embodiments, the first circuit element 350a may be coupled between the gate lead pad 382 and the gate terminal 22 of the RF transistor amplifier die 10. Consequently, the first circuit element 350a may be electrically coupled between gates of the RF transistor amplifier die 10 and the gate lead pad 382. In some embodiments, the first circuit element 350a may be coupled to the first side 201 of the interconnect structure 210. Thus, the first circuit element 350a may be coupled to a same side (e.g., the first side 201) of the interconnect structure 210 as the RF transistor amplifier die 10.

Similarly, the conductive patterns 373 may connect the second interconnection pad 324 to one or more second surface connection pads 374 and the drain lead pad 384. In some embodiments, a second circuit element 350b may be coupled to one or more of the second surface connection pads 374 so as to be electrically coupled between the drain lead pad 384 and the second interconnection pad 324. In some embodiments, the second surface connection pads 374 may be exposed on the first side 201 of the interconnect structure 210. In some embodiments, the second circuit element 350b may be coupled between the drain lead pad 384 and the drain terminal 24 of the RF transistor amplifier die 10. Consequently, the second circuit element 350b may be electrically coupled between drains of the RF transistor amplifier die 10 and the drain lead pad 384. In some embodiments, the second circuit element 350b may be coupled to the first side 201 of the interconnect structure 210. Thus, the second circuit element 350b may be coupled to a same side (e.g., the first side 201) of the interconnect structure 210 as the RF transistor amplifier die 10.

Though two second surface connection pads 374 and two first surface connection pads 372 are illustrated in FIG. 2A, it will be understood that additional pads and/or connection points are possible on and/or within the interconnect structure 210 to implement the electrical path between the gate lead pad 382, the first circuit element 350a, and the gate terminal 22 of the RF transistor amplifier die 10 and/or the electrical path between the drain lead pad 384, the second circuit element 350b, and the drain terminal 24 of the RF transistor amplifier die 10.

The first circuit element 350a and/or the second circuit element 350b may provide various electronic capabilities to the RF transistor amplifier 200A. For example, the first circuit element 350a and/or the second circuit element 350b may comprise impedances (including, for example, resistive, inductive, and capacitive elements) that may be used for impedance matching and/or harmonic termination. In some embodiments, the first circuit element 350a and/or the second circuit element 350b may be or include surface mount devices. In some embodiments, the first circuit element 350a and/or the second circuit element 350b may be or include integrated passive devices (IPDs). In some embodiments, the first circuit element 350a and/or the second circuit element 350b may be or include harmonic and/or input/output impedance matching elements. Though illustrated as externally mounted elements in FIG. 2A, in some embodiments, the first circuit element 350a and/or the second circuit element 350b may be implemented within the interconnect structure 210. For example, the first circuit element 350a and/or the second circuit element 350b may be implemented as traces, pads and/or paths internally within the structure of the interconnect structure 210 (e.g., as plate capacitors within the interconnect structure 210).

In some embodiments, the first circuit element 350a may be configured to provide input matching capabilities. Due to its location between the gate lead pad 382 and the RF transistor amplifier die 10, the first circuit element 350a may be capable of affecting and/or conditioning a signal provided to the gates of the RF transistor amplifier die 10. Similarly, the second circuit element 350b may be configured to provide output matching capabilities. Due to its location between the drain lead pad 384 and the RF transistor amplifier die 10, the second circuit element 350b may be capable of affecting and/or conditioning a signal provided from the drains of the RF transistor amplifier die 10. In some embodiments the first circuit element 350a and/or the second circuit element 350b may be configured to provide harmonic termination. For example, the first circuit element 350a and/or the second circuit element 350b may be configured to terminate a second or third order harmonics of the operating frequency of the RF transistor amplifier 200A.

By using the interconnect structure 210 with the exposed connection pads, such as the first and second surface connection pads 372, 374, surface mount devices can be used to provide circuit elements that may be coupled to the RF transistor amplifier die 10. The surface mount devices can be replaced and/or configured as necessary to provide a more flexible solution. For example, when a different type of input/output matching and/or harmonic termination is needed, the same interconnect structure 210 may be used, but the first and/or second circuit elements 350a, 350b may be swapped to provide different capabilities.

Though the first circuit element 350a and the second circuit element 350b are each illustrated as a single element, it will be understood that in some embodiments, the first circuit element 350a and/or the second circuit element 350b may include a plurality of discrete devices. The size and/or functionality of the first circuit element 350a may differ from that of second circuit element 350b. Similarly, the interconnections between the first and second circuit elements 350a, 350b and the RF transistor amplifier die 10 are merely examples, and different configurations of conductive patterns 373 may be provided without deviation from the present invention. Though FIG. 2A illustrates a first circuit element 350a on the gate side of the RF transistor amplifier die 10 and a second circuit element 350b on the drain side of the RF transistor amplifier die 10, it will be understood that in, some embodiments, one of the circuit elements may be omitted. For example, in some embodiments, only first circuit element 350a or second circuit element 350b may be present.

In some embodiments, spacer 245 may be formed on the RF transistor amplifier die 10. For example, the spacer 245 may be formed to be on and/or contact the source terminal 26 for the RF transistor amplifier die 10. In some embodiments, the spacer 245 may be formed of an electrically and/or thermally conductive material, such as metal. In some embodiments, the spacer 245 may be or include gold (Au) Copper (Cu), a Cu alloy, gold-tin (AuSn), and/or epoxy, though the present invention is not limited thereto. The spacer 245 may be configured to be electrically coupled to the source terminal 26 for the RF transistor amplifier die 10 and, consequently, to the sources of the RF transistor amplifier die 10 by way of the source vias 66. In some embodiments, an additional connection pad (not shown) may be provided that is electrically connected to the source terminal 26 such as, for example, by conductive patterns 373 and/or through the spacer 245. In some embodiments, the spacer 245 may be thermally conductive. As such, the spacer 245 may be configured to dissipate heat transferred from the RF transistor amplifier die 10.

For example, depending on the interface between source terminal 26 and the spacer 245, the source terminal 26 may directly contact the spacer 245. To improve the electrical and/or thermal interface between the source terminal 26 and the spacer 245, an electrically and/or thermally conductive grease can be used between them. Additionally, a bonding layer, such as a eutectic bond, a metal bond, a solder bond, an adhesive material or other suitable die attach or bonding material with desired electrical and/or thermal properties can be used, Such a bond layer can be formed of different metal layers in a metal stack or alloys of metals or other materials. Depending of the embodiment, the bond layer can be made of a thickness to serve a spacing function to provide a planar interface surface to facilitate electrical, thermal and/or mechanical connection.

As illustrated in FIG. 2A, in some embodiments, an encapsulating material 325 may be formed on the RF transistor amplifier die 10, the interconnect structure 210, the spacer 245, the gate lead pad 382, and/or the drain lead pad 384. The encapsulating material 325 may help prevent short circuits, enhance the structural integrity of the resulting device and provide for proper impedance matching. In some embodiments, the encapsulating material 325 may also encapsulate the RF transistor amplifier die 10 in protective material. In some embodiments, the encapsulating material may include, for example, silicon oxide, silicon nitride, a polymer, a molding compound, or a combination thereof.

In some embodiments, through vias 215A, 215B may be formed in the encapsulating material 325. The through vias 215A, 215B may include conductive material and provide a conductive path to the gate lead pad 382 and/or drain lead pad 384. For example, a first through via 215A may electrically connect the gate lead pad 382 to the gate connection pad 282 and expose gate connection pad 282 and a second through via 215B may electrically connect the drain lead pad 384 to the drain connection pad 284.

In some embodiments, the gate connection pad 282 and the drain connection pad 284 may be approximately coplanar. In some embodiments, the encapsulating material 325 may be configured to expose a bottom surface 245a of the spacer 245, and the gate connection pad 282 and the drain connection pad 284 may also be approximately coplanar with the bottom surface 245a of the spacer 245, though the present invention is not limited thereto.

The use of the gate connection pad 282 and the drain connection pad 284 may allow for the use of direct connections between the combination of the RF transistor amplifier die 10, the interconnect structure 210, and the first and second circuit elements 350a, 350b and other pads and/or dies. For example, the RF transistor amplifier 200A may be configured to allow the bonding of the gate connection pad 282, the drain connection pad 284, and/or the spacer 245 to a separate structure. For example, the gate connection pad 282 may be electrically connected (e.g., via a solder ball or bump) to a pad providing a gate signal, the drain connection pad 284 may be electrically connected (e.g., via a solder ball or bump) to a pad providing a drain signal, and the spacer 245 may be electrically connected (e.g., via a solder ball or bump) to a pad providing a source signal (e.g., a ground signal). The orientation of the gate connection pad 282, the drain connection pad 284, and the spacer 245 may allow for direct connections that do not require bond wires. This may allow for a more cost effective assembly and attachment.

The RF transistor amplifier 200A, including the interconnect structure 210, may be placed in various types of semiconductor packages. FIGS. 2B and 2C are schematic cross-sectional views of various packaging options 2000a, 2000b of the RF transistor amplifier 200A, according to some embodiments of the present invention. FIGS. 2B and 2C include elements of the RF transistor amplifier 200A, RF transistor amplifier die 10, and interconnect structure 210 that have been previously discussed. As such, the discussion of FIGS. 2B and 2C will focus on those portions of the embodiments that are different from those discussed with respect to the prior figures.

Referring to FIG. 2B, a semiconductor package 2000a may incorporate the RF transistor amplifier 200A according to some embodiments of the present invention. The semiconductor package 2000a may be, for example, an open-air or open-cavity package. The semiconductor package 2000a may include a carrier substrate 410, sidewalls 520, and a lid 525. The carrier substrate 410, sidewalls 520, and lid 525 may define an internal cavity 530. The RF transistor amplifier 200A, including the RF transistor amplifier die 10 and interconnect structure 210, may be disposed inside the internal cavity 530.

The carrier substrate 410 may include materials configured to assist with the thermal management of the semiconductor package 2000a. For example, the carrier substrate 410 may include copper and/or molybdenum. In some embodiments, the carrier substrate 410 may be composed of multiple layers and/or contain vias/interconnections. In an example embodiment, the carrier substrate 410 may be a multilayer copper/molybdenum/copper metal flange that comprises a core molybdenum layer with copper cladding layers on either major surface thereof. The provided examples of the materials of the carrier substrate 410 are not intended to limit the present invention.

The sidewalls 520 and/or lid 525 may be formed of or include an insulating material in some embodiments. For example, the sidewalls 520 and/or lid 525 may be formed of or include ceramic and/or a PCB. In some embodiments, the sidewalls 520 and/or lid 525 may be formed of, for example, $Al_2O_3$. The lid 525 may be glued to the sidewalls 520 using an epoxy glue. The sidewalls 520 may be attached to the carrier substrate 410 via, for example, brazing. Leads 415A, 415B may be configured to extend through the sidewalls 520, though the present invention is not limited thereto.

In some embodiments, the RF transistor amplifier 200A may be disposed on the carrier substrate 410 and the leads 415A, 415B. The leads 415A, 415B may be respectively coupled to the gate connection pad 282 and the drain connection pad 284 of the RF transistor amplifier 200A using, for example, a conductive die attach material. In some embodiments, the leads 415A, 415B may extend from the sidewalls 520 to contact and/or be electrically bonded to the gate connection pad 282 and/or the drain connection pad 284. As such, in some embodiments, the use of wire bonds to connect the RF transistor amplifier 200A to leads 415A, 415B may be avoided and/or reduced. Moreover, because the RF transistor amplifier 200A may be attached to the package substrate primarily by a conductive die attach, such as solder, assembly of the semiconductor package 2000a may be simpler and more cost effective than traditional devices.

The circuit elements 350a and/or 350b that are mounted on the interconnect structure 210 may include, for example, input matching components and output matching components that are used to impedance match at the fundamental frequency and/or harmonic termination circuitry to terminate intermodulation products to ground. These circuit elements 350a, 350b may be passive RF components that include resistors, capacitors and/or inductors that are implemented (at least partially) in integrated passive devices or printed circuit boards, for example. Leads 415A, 415B allow the RF transistor amplifier 200A to be connected to external devices/circuits/power sources. In the depicted embodiment, interconnect structure 210 is used to connect the conductive leads 415A, 415B to circuit elements 350a, 350b. An RF signal input to the RF transistor amplifier 200A on a first lead 415A may be passed through the interconnect structure 210 to circuit element 350a and from there to a gate terminal 22 of the RF transistor amplifier die 10, and the amplified output RF signal may be passed from the drain terminal 24 of the RF transistor amplifier die 10 to the circuit element 350b and from there through the interconnect structure 210 where the RF signal is output through lead 415B.

In some embodiments, the spacer 245 may be electrically and/or thermally coupled to the carrier substrate 410. For example, the carrier substrate 410 may be electrically grounded, e.g., through an external connection (not shown), and the spacer 245 may be further electrically coupled to the source terminal 26. Thus, a ground signal may be provided to the source fingers of the RF transistor amplifier die 10. The spacer 245 may also be configured to thermally transfer heat from the RF transistor amplifier die 10 to the carrier substrate 410. Thus, the spacer 245 may assist with thermal management of the RF transistor amplifier 200A. In some embodiments, a spacer 245 may be bonded to the source terminal 26 on one side and a bonding layer/structure may be provided on the other side of the spacer 245 or on the substrate 410 to bond the spacer 245 to the substrate 410.

In some embodiments, the spacer 245 may be electrically isolated from the carrier substrate 410, and a connection to a reference signal (e.g., ground) may be provided within the semiconductor package 2000a to couple directly to the spacer 245. In some embodiments, the spacer 245 may be electrically insulating, and a connection to a reference signal (e.g., ground) may be provided within the semiconductor package 2000a to couple directly to the source terminal 26 of the RF transistor amplifier die 10. For example, the RF transistor amplifier 200A may provide an electrical connection to which the reference signal may be attached so as to be electrically connected to the source terminal 26 of the RF transistor amplifier 200A.

FIG. 2B also illustrates the use of a riser 412. The riser 412 may be a portion of (e.g., integral with) the carrier substrate 410 or an additional separate structure. In some embodiments, the riser 412 may include elements such as, for example, a spacer (e.g., composed similarly to spacer 425), a bonding/attach layer (e.g., a eutectic layer, an epoxy layer), a metal layer, and/or a thermally conductive layer. The riser 412 may be formed of one or multiple layers. In some embodiments, the riser 412 may be utilized to raise a level of the RF transistor amplifier 200A and/or provide a planar surface for mounting the RF transistor amplifier 200A.

Referring to FIG. 2C, a semiconductor package 2000b may incorporate the RF transistor amplifier 200A according to embodiments of the present invention. The semiconductor package 2000b may be, for example, an overmolded plastic (OMP) package. The semiconductor package 2000b may include a carrier substrate 410 upon which the RF transistor amplifier 200A incorporating the interconnect structure 210 is disposed.

The RF transistor amplifier 200A, the RF transistor amplifier die 10, and the interconnect structure 210 may be encased in an overmold material 540. The overmold material 540 may be formed of a plastic or a plastic polymer compound, which is injection molded around RF transistor amplifier 200A, thereby providing protection from the outside environment.

Methods of manufacturing an OMP semiconductor package 2000b that may be modified to incorporate the RF transistor amplifier 200A including the interconnect structure 210 are described in U.S. Pat. No. 9,515,011 entitled "Over-mold plastic packaged wide band-gap power transistors and MMICS," to Wood et al., issued Dec. 6, 2016, the disclosure of which is incorporated herein by reference as if set forth fully herein.

In the semiconductor package 2000b according to the present invention, leads 415A, 415B may extend from outside the semiconductor package 2000b and into the overmold material 540 so as to contact and/or be electrically connected (e.g., by conductive die attach material) to the gate connection pad 282 and/or the drain connection pad 284 of the RF transistor amplifier 200A. As such, in some embodiments, the use of wire bonds to connect the RF transistor amplifier 200A to leads 415A, 415B may be avoided and/or reduced. Moreover, because the RF transistor amplifier 200A may be attached within the semiconductor package 2000b primarily by a conductive die attach, such as solder, assembly of the semiconductor package 2000b may be simpler and more cost effective than traditional devices.

As in semiconductor package 2000a, the carrier substrate 410 of semiconductor package 2000b may include materials configured to assist with thermal management. For example, the carrier substrate 410 may include copper and/or molybdenum. In some embodiments, the carrier substrate 410 may be composed of multiple layers and/or contain vias/interconnections. In some embodiments, the carrier substrate 410 may include a metal heat sink that is part of a lead frame or metal slug that is at least partially surrounded by a plastic overmold material 540. The provided examples of the materials of the carrier substrate 410 are not intended to limit the present invention. In some embodiments, the leads 415A, 415B may be electrically isolated from the carrier substrate 410. For example, in some embodiments an insulating layer 535 may be between the leads 415A, 415B and the carrier substrate 410.

As with the semiconductor package 2000a, the carrier substrate 410 of semiconductor package 2000b may be electrically and/or thermally coupled to the spacer 245. For example, the carrier substrate 410 may be electrically grounded, e.g., through an external connection (not shown), and the spacer 245 may be further electrically coupled to the source terminal 26 of the RF transistor amplifier die 10. Thus, a ground signal may be provided to the sources of the RF transistor amplifier die 10. The signal to the source terminal 26 may also be supplied through an external connection to the spacer 245 and/or through an electrical connection via conductive patterns coupled to the source terminal 26, as discussed herein with respect to the semiconductor package 2000a. In some embodiments, the semiconductor package 2000b may incorporate a riser 412, as discussed herein with respect to FIG. 2A.

The packaging embodiments illustrated in FIGS. 2B and 2C are merely examples meant to illustrate how the interconnect structure 210 and the RF transistor amplifier die 10 may be coupled within a semiconductor package. It will be understood that multiple other possible configurations and/or orientations of the semiconductor package are possible without deviating from the present invention.

While FIGS. 2A to 2C illustrate embodiments in which circuit elements 350a, 350b are on a bottom surface (e.g., first side 201) of the interconnect structure 210 (e.g., between the interconnect structure 210 and the RF transistor amplifier die 10), it will be understood that other combinations are available. In some embodiments, the circuit elements 350a, 350b may be on an upper surface of the interconnect structure 210 (e.g., opposite the interconnect structure 210 from the RF transistor amplifier die 10). In some embodiments, the circuit elements 350a, 350b may be on both sides of the interconnect structure 210. In some embodiments, the circuit elements 350a, 350b may be on side surfaces of the interconnect structure 210.

Figure 2D:
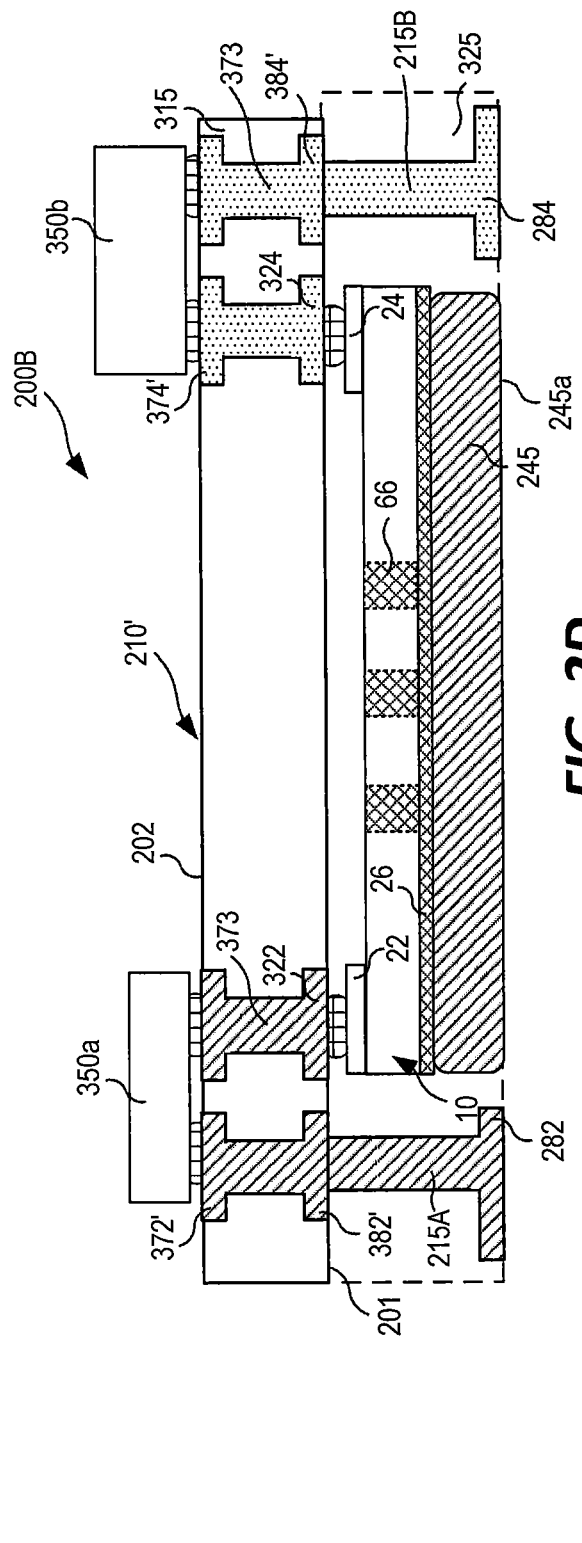
FIG. 2D is a schematic cross-sectional view of another embodiment of an RF transistor amplifier, according to some embodiments of the present invention.

FIG. 2D is a schematic cross-sectional views of another embodiment of an RF transistor amplifier 200B, according to some embodiments of the present invention. Referring to FIG. 2D, the RF transistor amplifier 200B may be similar to the RF transistor amplifier 200A of FIG. 2A with the major difference being that the first and second circuit elements 350a, 350b are disposed on a top surface of the interconnect structure 210'.

The interconnect structure 210' may have a second side 202 that is opposite the interconnect structure 210' from the first side 201. The first surface connection pads 372' and second surface connection pads 374' may be exposed on the second side 202 of the interconnect structure 210'. The first and second surface connection pads 372', 374' may be respectively coupled to the first interconnection pad 322 and the second interconnection pad 324 by conductive patterns 373 within the interconnect structure 210'. The first and second interconnection pads 322, 324 may be configured to respectively couple to the gate terminal 22 and drain terminal 24 of the RF transistor amplifier die 10.

As with the interconnect structure 210 of FIG. 2A, the interconnect structure 210' may have an exposed a gate lead pad 382' and an exposed drain lead pad 384' on the first side 201 of interconnect structure 210'. The gate lead pad 382' and the drain lead pad 384' may each be respectively coupled to gate connection pad 282 and drain connection pad 284 by through vias 215A, 215B.

In RF transistor amplifier 200B, the first circuit element 350a may be coupled to the first surface connection pads 372' on the second side 202 (e.g., the top surface) of the interconnect structure 210'. Similarly, the second circuit element 350b may be coupled to the second surface connection pads 374' on the second side 202 (e.g., the top surface) of the interconnect structure 210'. The first circuit element 350a may thus be electrically coupled in the path between the gate lead pad 382' and the gate terminal 22 of the RF transistor amplifier die 10. Similarly, the second circuit element 350b may thus be electrically coupled in the path between the drain lead pad 384' and the drain terminal 24 of the RF transistor amplifier die 10.

As will be understood by one of ordinary skill in the art, the RF transistor amplifier 200B of FIG. 2D may be mounted in a package, such as semiconductor packages 2000a, 2000b of FIGS. 2B and 2C, in a similar manner as the RF transistor amplifier 200A of FIG. 2A.

Figure 3A:
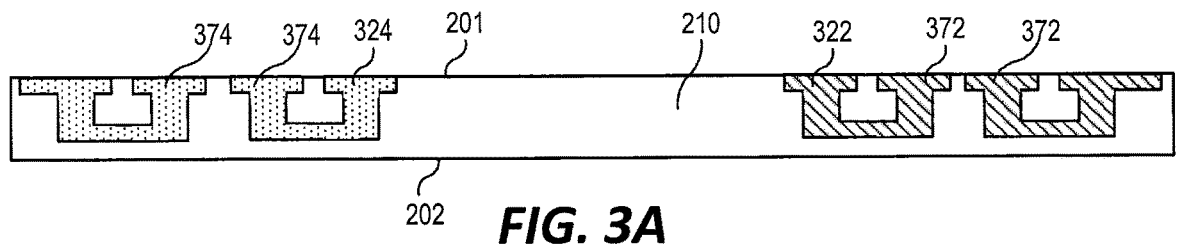
FIGS. 3A to 3F are schematic diagrams illustrating methods of forming an RF transistor amplifier, according to some embodiments of the present invention.

FIGS. 3A to 3F are schematic diagrams illustrating methods of coupling interconnect structures 210 and RF transistor amplifier dies 10 to form RF transistor amplifier 200A, according to certain embodiments of the present invention. As shown in FIG. 3A, an interconnect structure 210 may be provided. The interconnect structure 210 may have a first side 201 and a second side 202. In some embodiments, the first side 201 may include exposed first and second interconnection pads 322, 324 as well as first and second surface connection pads 372, 374.

Figure 3B:
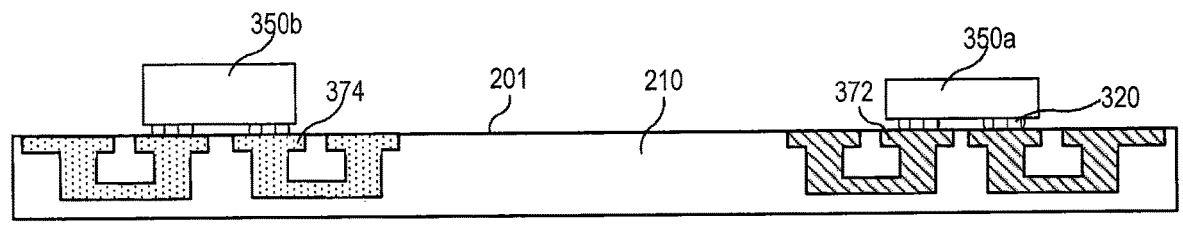

Referring to FIG. 3B, a first circuit element 350a and a second circuit element 350b may be mounted on the first side 201 of the interconnect structure 210. For example, a bonding element (e.g., solder balls and/or bumps 320) may be used to couple the first circuit element 350a to the first surface connection pad(s) 372. Similarly, a bonding element (e.g., solder balls and/or bumps 320) may be used to couple the second circuit element 350b to the second surface connection pad(s) 374.

Figure 3C:
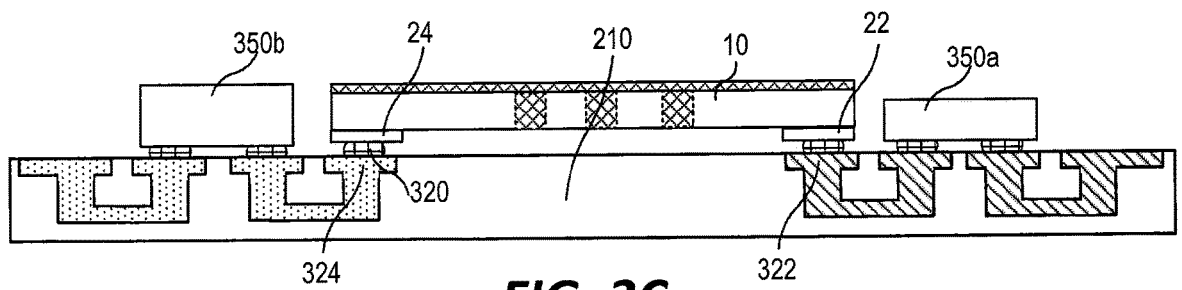

Referring to FIG. 3C, an RF transistor amplifier die 10 may be mounted on the first side 201 of the interconnect structure 210. For example, a bonding element (e.g., solder balls and/or bumps 320) may be used to couple the gate terminal 22 and the drain terminal 24 of the RF transistor amplifier die 10 to the first and second interconnection pads 322, 324, respectively. In will be understood that the order of FIGS. 3B and 3C may be reversed such that the RF transistor amplifier die 10 is coupled to the interconnect structure 210 before the first and second circuit elements 350a, 350b.

Figure 3D:
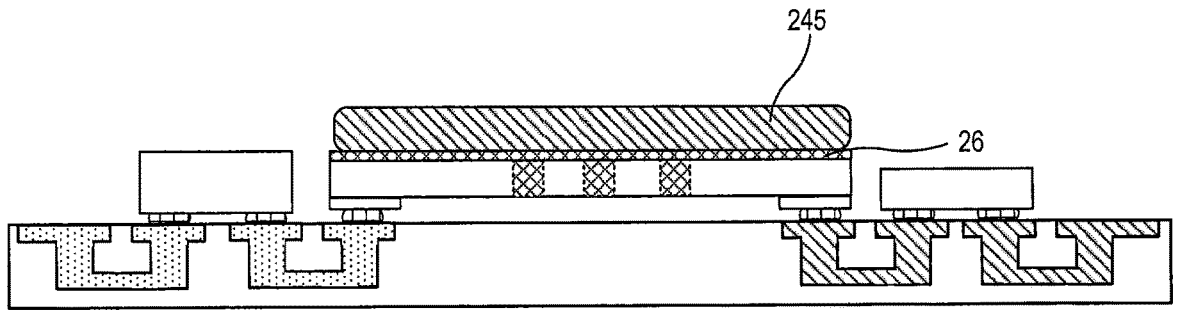

Referring to FIG. 3D, a spacer 245 may be provided on the source terminal 26 of the RF transistor amplifier die. In some embodiments, the spacer 245 may be coupled to the source terminal 26 by a die attach layer, such as a eutectic layer. In some embodiments, the spacer 245 may be coupled to the source terminal 26 by a metal layer to form a eutective or other metal bond. In some embodiments, the spacer 245 may be coupled to the source terminal 26 by a thermal adhesive.

Figure 3E:
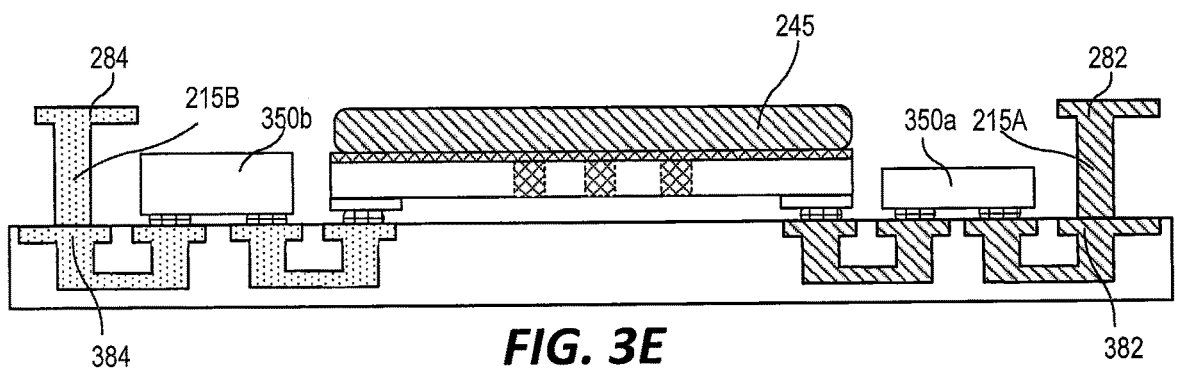

Referring to FIG. 3E, through vias 215A, 215B may be respectively formed on gate lead pad 382 and the drain lead pad 384. For example, the through vias 215A, 215B may be formed by forming a conductive pillar on the gate lead pad 382 and a conductive pillar on the drain lead pad 384. In some embodiments, the through vias 215A, 215B may comprise copper pillars. For example, the conductive pillars may be formed by electroplating copper seed layers on the gate and drain lead pads 382, 384 and using one or more masks to form the through vias 215A, 215B thereon. The gate connection pad 282 and the drain connection pad 284 may then be formed on the through vias 215A, 215B.

Figure 3F:
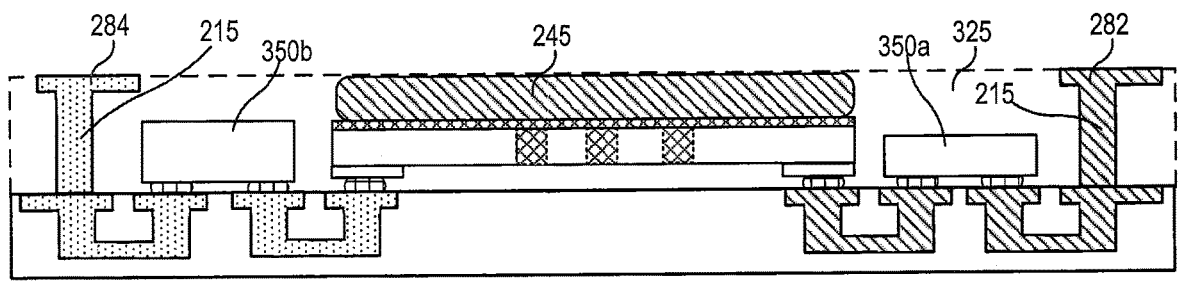

As shown in FIG. 3F, an encapsulating material 325 may be injected (e.g., by a capillary underfill process) between the conductive structures of the RF transistor amplifier die 10, the first and second circuit elements 350a, 350b, the interconnect structure 210, the through vias 215A, 215B, the gate connection pad 282, and/or the drain connection pad 284. The encapsulating material 325 may help prevent short circuits, enhance the structural integrity of the resulting device and provide for proper impedance matching. In some embodiments, the encapsulating material 325 may also encapsulate the RF transistor amplifier die 10 in protective material. The encapsulating material 325 may be processed (e.g., planarized) to expose the gate connection pad 282, the drain connection pad 284, and/or the spacer 245.

In some embodiments, the order of the operations shown in FIGS. 3E and 3F may be reversed. For example, in some embodiments, the encapsulating material 325 may be formed on the RF transistor amplifier die 10, the first and second circuit elements 350a, 350b, and/or the interconnect structure 210. Subsequently, the through vias 215A, 215B may be formed in the encapsulating material 325. For example, the encapsulating material 325 may be etched or otherwise selectively removed to expose the gate lead pad 382 and the drain lead pad 384. The through vias 215A, 215B may then be formed on the gate lead pad 382 and the drain lead pad 384 within the encapsulating material 325. The gate connection pad 282 and/or the drain connection pad 284 may be formed on and connected to the through vias 215A, 215B so as to be exposed from the encapsulating material 325 as illustrated in FIG. 3F.

Figure 4A:
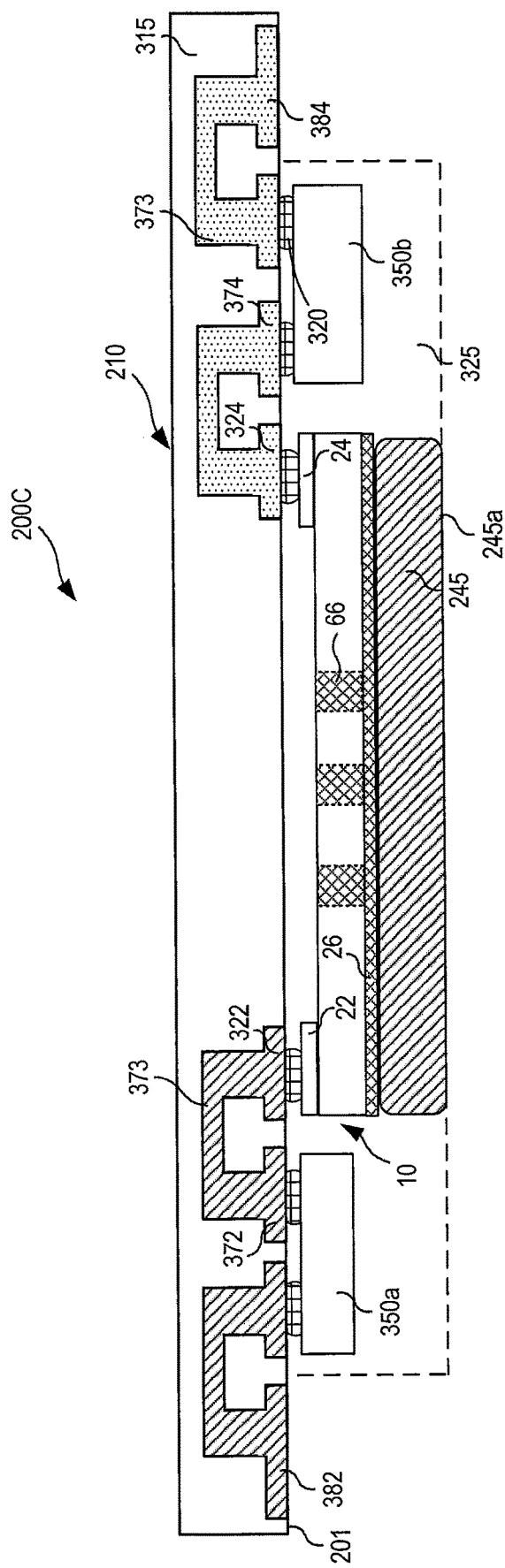
FIGS. 4A to 4C are schematic cross-sectional views of RF transistor amplifiers according to further embodiments of the present invention.
Figure 4B:
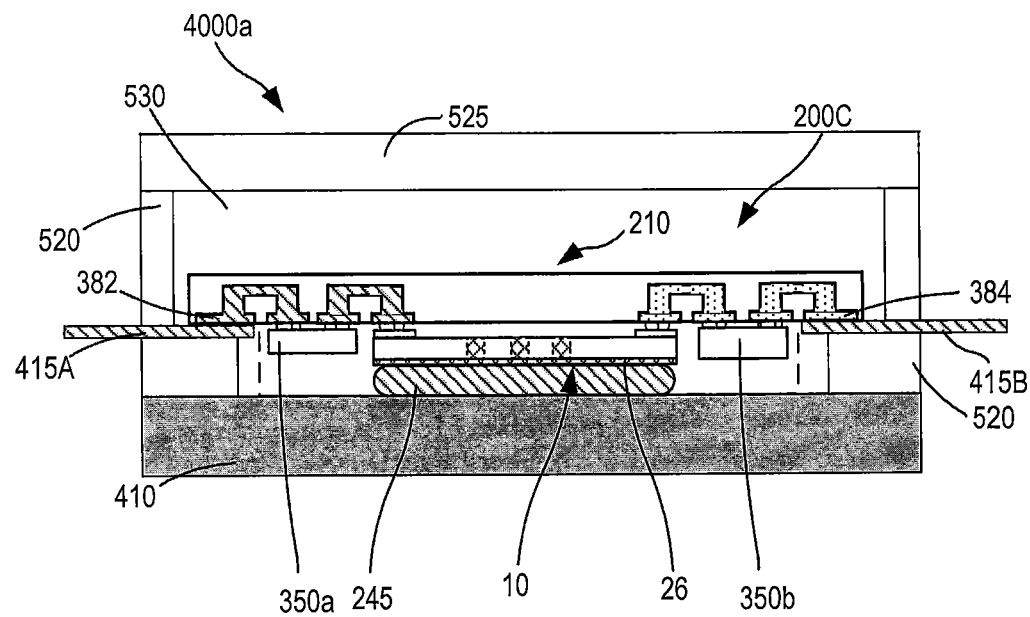
Figure 4C:
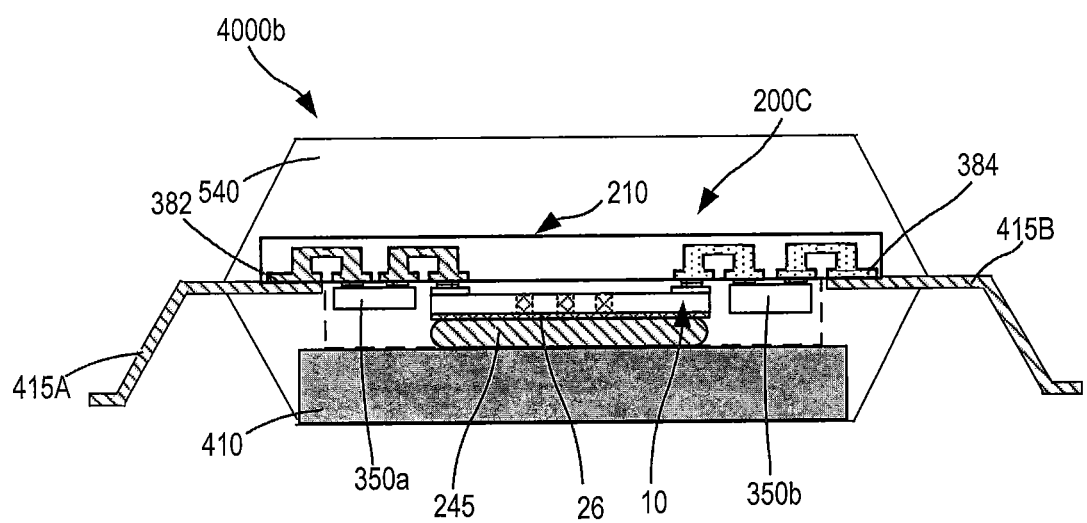

In some embodiments, the through vias 215A, 215B and/or portions of the encapsulating material 325 may be omitted. For example, FIGS. 4A to 4C are schematic cross-sectional views of an RF transistor amplifier 200C including an RF transistor amplifier die 10 coupled to interconnect structure 210, according to some embodiments of the present invention. As illustrated in FIG. 4A, the interconnect structure 210 may be substantially similar to that of FIGS. 2A to 2C and, as such, a duplicate description thereof will be omitted. The embodiment of the RF transistor amplifier 200C of FIG. 4A, for example, may omit portions of the encapsulating material 325, through vias 215A, 215B, and/or the gate/drain connection pads 282, 284 and directly expose the gate lead pad 382 and the drain lead pad 384.

As illustrated in FIG. 4A, the encapsulating material 325 may be on portions of the RF transistor amplifier die 10, portions of the first side 201 of the interconnect structure 210, and the first and second circuit elements 350a, 350b. In some embodiments, a bottom surface 245a of the spacer 245 may be exposed by the encapsulating material 325. It will be understood that, in some embodiments, different configurations of the encapsulating material 325 may be present. For example, in some embodiments, all of the encapsulating material 325 may be removed. In some embodiments, the encapsulating material 325 may be on the RF transistor amplifier die 10, but not on the first and second circuit elements 350a, 350b.

In the RF transistor amplifier 200C, direct connections (e.g., via solder balls and/or bumps) may be made to the gate lead pad 382, the drain lead pad 384, and/or the spacer 245. The use of direct connections may reduce and/or eliminate the use of wire bonds.

It will be understood the a method of manufacturing of RF transistor amplifier 200C may be similar to that of RF transistor amplifiers 200A and 200B illustrated with respect to FIGS. 3A to 3F. For example, manufacturing the RF transistor amplifier 200C may omit the formations of the through vias 215A, 215B (illustrated with respect to FIG. 3E) and, when forming the encapsulating material 325 (illustrated with respect to FIG. 3F), may omit portions of the encapsulating material formed on the gate lead pad 382 and/or the drain lead pad 384.

The RF transistor amplifier 200C illustrated in FIG. 4A may be utilized in multiple packaging configurations. FIGS. 4B and 4C illustrate the use of packaging similar to that discussed herein with respect to FIGS. 2B and 2C. For example, the interconnect structure 210 and the RF transistor amplifier die 10 may be placed in an open-cavity semiconductor package 4000a (FIG. 4B) or an OMP package 4000b (FIG. 4C). Elements in FIGS. 4B and 4C of the semiconductor package 4000a and semiconductor package 4000b that are similar to those previously discussed with respect to FIGS. 2B and 2C will not be discussed further for the sake of brevity. In some embodiments, the gate lead pad 382 may be coupled to gate lead 415A by a bonding element (e.g., solder balls and/or bumps) and the drain lead pad 384 may also be coupled to drain lead 415B. It will be understood that multiple other possible configurations and/or orientations of the semiconductor package are possible without deviating from the present invention.

The leads 415A, 415B may be configured to extend through the sidewalls 520 (FIG. 4B) and/or the overmold material 540 (FIG. 4C), though the present invention is not limited thereto. In some embodiments, RF transistor amplifier die 10 may be disposed on the carrier substrate 410, and the interconnect structure 210 may be disposed on the RF transistor amplifier die 10 and the leads 415A, 415B. The leads 415A, 415B may be coupled to the first side 201 of the interconnect structure 210 and may be electrically connected to the RF transistor amplifier die 10 through the interconnect structure 210. Moreover, the interconnect structure 210 incorporates the first and second circuit elements 350a, 350b that may allow for additional internalized functionality, such as harmonic termination and/or input/output impedance matching. In addition, the use of the interconnect structure 210 allows for greater flexibility in that different performance characteristics (e.g., to address harmonics at different frequencies, different impedances, etc.) may be achieved simply by swapping interconnect structure 210 and/or first and second circuit elements 350a, 350b.

In some embodiments, the spacer 245 may be electrically and/or thermally coupled to the carrier substrate 410. For example, the carrier substrate 410 may be electrically grounded, e.g., through an external connection (not shown), and the spacer 245 may be further electrically coupled to the source terminal 26. Thus, a ground signal may be provided to the source fingers of the RF transistor amplifier die 10.

In some embodiments, the spacer 245 may be electrically isolated from the carrier substrate 410, and a connection to a reference signal (e.g., ground) may be provided within the semiconductor packages 4000a, 4000b to couple directly to the spacer 245. In some embodiments, the spacer 245 may be electrically insulating, and a connection to a reference signal (e.g., ground) may be provided within the semiconductor packages 4000a, 4000b to couple directly to the source terminal 26 of the RF transistor amplifier die 10. For example, the RF transistor amplifier 200C may provide an external connection to which the reference signal may be attached so as to be electrically connected to the source terminal 26 of the RF transistor amplifier 200C.

In FIGS. 4A to 4C, the first and second circuit elements 350a, 350b are illustrated as being on the same side (first side 201) of the interconnect structure 210. However, the present invention is not limited thereto. Similar to the embodiment of FIG. 2D, the embodiment of FIG. 4A could be modified so that the first and second circuit elements 350a, 350b are on the second side 202 of an interconnect structure 210 or so that one of the first and second circuit elements 350a, 350b are on the first side 201 of an interconnect structure 210 and the other is on the first and second circuit elements 350a, 350b are on the second side 202 of an interconnect structure 210.

Figure 5A:
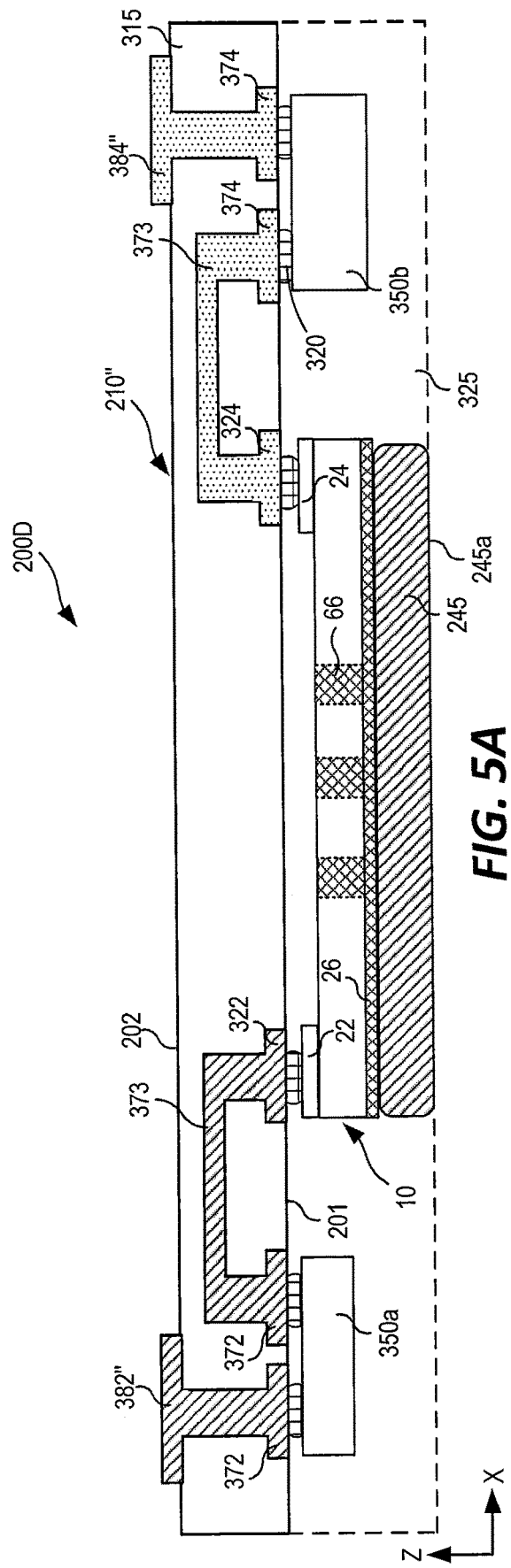
FIGS. 5A to 5C are schematic cross-sectional views of RF transistor amplifiers according to additional embodiments of the present invention.
Figure 5B:
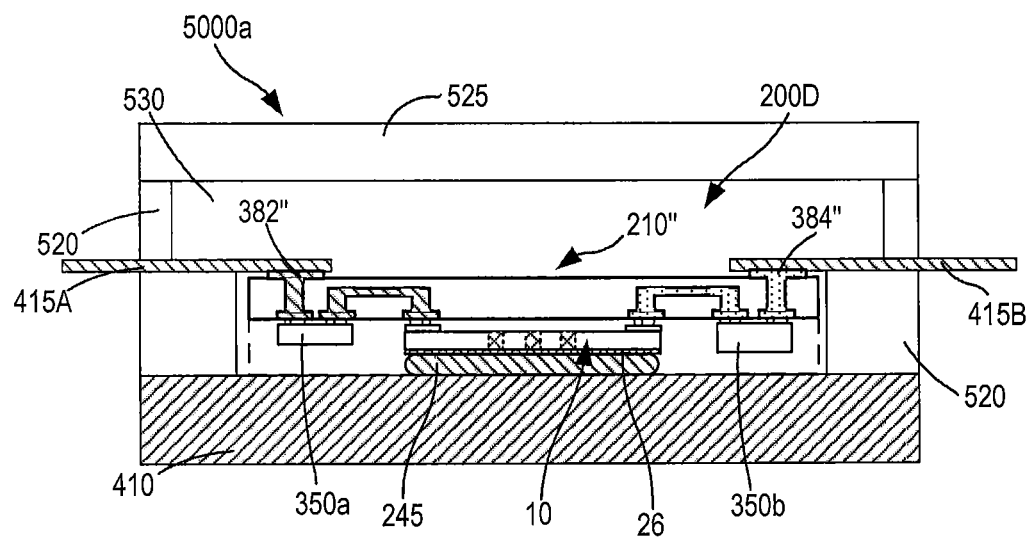
Figure 5C:
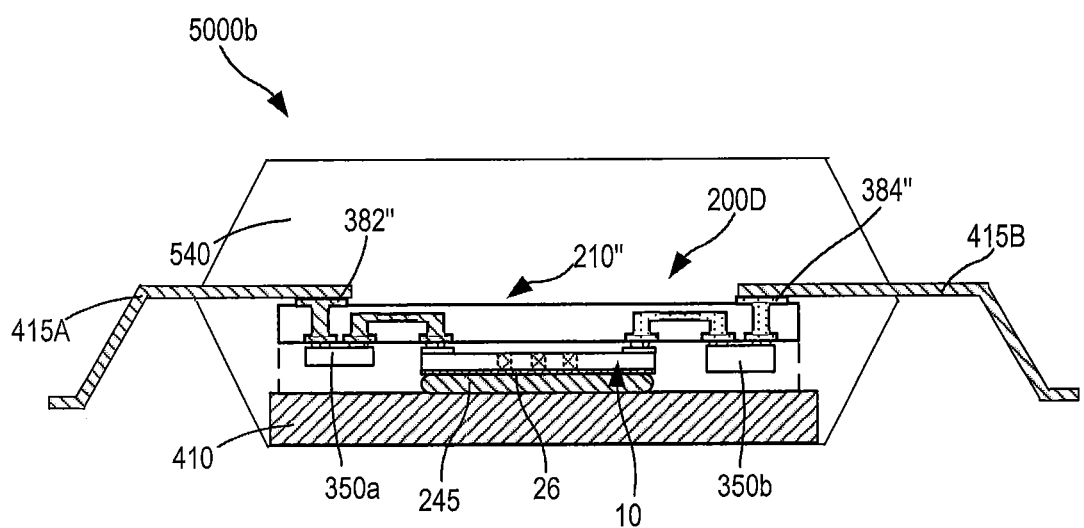

In FIGS. 2A to 2C and 4A to 4C, the gate lead pad 382 and the drain lead pad 384 are provided on a same side of the interconnect structure 210 as the first circuit element 350a and the second circuit element 350b. However, the embodiments of the present invention are not limited thereto. For example, FIGS. 5A to 5C are schematic cross-sectional views of an RF transistor amplifier 200D including an RF transistor amplifier die 10 coupled to interconnect structure 210", according to some embodiments of the present invention. As illustrated in FIG. 5A, the interconnect structure 210" may be include similar elements to that of FIGS. 2A to 2C and, as such, a duplicate description thereof will be omitted. The embodiment of the RF transistor amplifier 200D of FIG. 5A, for example, may provide a gate lead pad 382" and a drain lead pad 384" on the second side 202 of the interconnect structure 210", opposite from the first circuit element 350a and the second circuit element 350b.

Referring to FIG. 5A, the interconnect structure 210" may have a second side 202 that is opposite the interconnect structure 210" from the first side 201. The gate lead pad 382" and the drain lead pad 384" may be on the second side 202 of the interconnect structure 210". The gate and drain lead pads 382", 384" may be respectively coupled to the first and second circuit elements 350a, 350b by conductive patterns 373 within the interconnect structure 210". For example, the gate lead pad 382" may be coupled to the first surface connection pads 372 by conductive patterns 373 and the drain lead pad 384" may be coupled to the second surface connection pads 374 by conductive patterns 373. The first and second interconnection pads 322, 324 may be respectively coupled by additional conductive patterns 373 to the first and second circuit elements 350a, 350b. The first and second interconnection pads 322, 324 may be configured to respectively couple to the gate terminal 22 and drain terminal 24 of the RF transistor amplifier die 10.

Unlike the interconnect structure 210 of FIG. 2A, the interconnect structure 210" may expose a gate lead pad 382" and a drain lead pad 384" on the second side 202 of interconnect structure 210". In RF transistor amplifier 200D, the first circuit element 350a may be coupled to the first surface connection pads 372 on the first side 201 of the interconnect structure 210". Similarly, the second circuit element 350b may be coupled to the second surface connection pads 374 on the first side 201 of the interconnect structure 210". The first circuit element 350a may thus be electrically coupled in the path between the gate lead pad 382" and the gate terminal 22 of the RF transistor amplifier die 10. Similarly, the second circuit element 350b may thus be electrically coupled in the path between the drain lead pad 384" and the drain terminal 24 of the RF transistor amplifier die 10.

FIGS. 5B and 5C illustrate the use of packaging for the embodiment of FIG. 5A that is similar to that discussed herein with respect to FIGS. 2B and 2C. For example, the interconnect structure 210" and the RF transistor amplifier die 10 may be placed in an open-cavity semiconductor package 5000a (FIG. 5B) or an OMP package 5000b (FIG. 5C). Elements in FIGS. 5B and 5C of the semiconductor package 5000a and semiconductor package 5000b that are similar to those previously discussed with respect to FIGS. 2B and 2C and/or 4B and 4C will not be discussed further for the sake of brevity. In some embodiments, the gate lead pad 382" may be coupled to gate lead 415A by a bonding element (e.g., solder balls and/or bumps) and the drain lead pad 384" may also be coupled to drain lead 415B. In some embodiments, the gate lead 415a and/or the drain lead 415b may extend over the second side 202 of the interconnect structure 210" to be coupled to the gate lead pad 382" and drain lead pad 384" respectively. In some embodiments, portions of the interconnect structure 210" may be below the gate lead 415a and/or the drain lead 415b. It will be understood that multiple other possible configurations and/or orientations of the semiconductor package are possible without deviating from the present invention.

The leads 415A, 415B may be configured to extend through the sidewalls 520 (FIG. 5B) and/or the overmold material 540 (FIG. 5C), though the present invention is not limited thereto. In some embodiments, RF transistor amplifier die 10 may be disposed on the carrier substrate 410, the interconnect structure 210" may be disposed on the RF transistor amplifier die 10, and the leads 415A, 415B may be disposed on the interconnect structure 210". The leads 415A, 415B may be coupled to the second side 202 of the interconnect structure 210" and may be electrically connected to the RF transistor amplifier die 10 through the interconnect structure 210". Moreover, the interconnect structure 210" may be coupled to and/or include the first and second circuit elements 350a, 350b that may allow for additional internalized functionality, such as harmonic termination and/or input/output impedance matching.

In some embodiments, the spacer 245 may be electrically and/or thermally coupled to the carrier substrate 410. For example, the carrier substrate 410 may be electrically grounded, e.g., through an external connection (not shown), and the spacer 245 may be further electrically coupled to the source terminal 26. Thus, a ground signal may be provided to the sources of the RF transistor amplifier die 10.

In some embodiments, the spacer 245 may be electrically isolated from the carrier substrate 410, and a connection to a reference signal (e.g., ground) may be provided within the semiconductor packages 5000a, 5000b to couple directly to the spacer 245. In some embodiments, the spacer 245 may be electrically insulating, and a connection to a reference signal (e.g., ground) may be provided within the semiconductor packages 5000a, 5000b to couple directly to the source terminal 26 of the RF transistor amplifier die 10. For example, the RF transistor amplifier 200D may provide an external connection to which the reference signal may be attached so as to be electrically connected to the source terminal 26 of the RF transistor amplifier die 10.

In FIGS. 2A-5C, various ones of the embodiments illustrate an encapsulating material 325 of an RF transistor amplifier 200A-D that is on the first and second circuit elements 350a, 350b. However, the present invention is not limited to such a configuration. Depending on the electrical and thermal requirements for the first and second circuit elements 350a, 350b, alternative and/or additional terminal/bonding/spacer structures can be utilized with at least one of the first and second circuit elements 350a, 350b to provide electrical conductivity, thermal conductivity and/or a mechanical interface to one of more of the first and second circuit elements 350a, 350b.

In some embodiments, surfaces of the first and second circuit elements 350a, 350b may be exposed and/or coupled to auxiliary spacers as part of the RF transistor amplifier. For example, FIG. 6A is a schematic cross-sectional view of an RF transistor amplifier 200E including an RF transistor amplifier die 10 coupled to interconnect structure 210, according to some embodiments of the present invention. As illustrated in FIG. 6A, the interconnect structure 210 and/or RF transistor amplifier die 10 may be substantially similar to that of FIGS. 2A to 2C and, as such, a duplicate description thereof will be omitted. The embodiment of the RF transistor amplifier 200E of FIG. 6A, for example, may include a first auxiliary spacer 246a and a second auxiliary spacer 246b.

In some embodiments, first auxiliary spacer 246a may be formed on the first circuit element 350a. In some embodiments, second auxiliary spacer 246b may be formed on the second circuit element 350B. For example, the first auxiliary spacer 246a may be formed to be on and/or contact the first circuit element 350a and the second auxiliary spacer 246b may be formed to be on and/or contact the second circuit element 350b. In some embodiments, the first and/or second auxiliary spacers 246a, 246b may be formed of an electrically and/or thermally conductive material, such as metal. In some embodiments, a surface of the first and/or second auxiliary spacers 246a, 246b may be exposed from the encapsulating material 325. In some embodiments, the first and/or second auxiliary spacers 246a, 246b may be or include gold (Au) Copper (Cu), a Cu alloy, gold-tin (AuSn), and/or epoxy, though the present invention is not limited thereto. The first and/or second auxiliary spacers 246a, 246b may be configured to be electrically coupled to the first and/or second circuit elements 350a, 350b and may, for example, provide a mechanism by which a ground signal is provided to the first and/or second circuit elements 350a, 350b. In some embodiments, the first and/or second auxiliary spacers 246a, 246b may be thermally conductive. As such, the first and/or second auxiliary spacers 246a, 246b may be configured to dissipate heat transferred from the first and/or second circuit elements 350a, 350b.

In some embodiments the first and/or second auxiliary spacers 246a, 246b may be composed of a similar material as the spacer 245, though the present invention is not limited thereto. In some embodiments, the first and/or second auxiliary spacers 246a, 246b may be composed of a different material than the spacer 245. In some embodiments, the first and/or second auxiliary spacers 246a, 246b may be electrically disconnected from the spacer 245. Forming the first and/or second auxiliary spacers 246a, 246b from a different material than, and/or electrically disconnected from, the spacer 245 may assist in limiting current sharing and/or current eddies between the RF transistor amplifier die 10 and the first and/or second circuit elements 350a, 350b. Though the first auxiliary spacer 246a, the second auxiliary spacer 246b, and the spacer 245 are illustrated as separate discrete elements, the present invention is not limited thereto. In some embodiments, the first auxiliary spacer 246a, the second auxiliary spacer 246b, and the spacer 245 may be connected together as an integral layer (see, e.g., FIG. 6C).

The materials/thicknesses of the first and second auxiliary spacers 246a, 246b can be the same or different materials/ thicknesses as the spacer 245. In some embodiments, the spacer 245 and the first and second auxiliary spacers 246a, 246b have different thicknesses so that the bottoms of the first and second auxiliary spacers 246a, 246b are planar with the bottom of the spacer 245 for ease of packaging/manufacture/bonding of the RF transistor amplifier 200E to a package substrate or a circuit board. In some embodiments, the spacer 245 and the first and second auxiliary spacers 246a, 246b are the same thickness. In still other embodiments, the spacer 245 spans across the RF transistor amplifier die 10 and at least one or all of the first and second circuit elements 350, 350b to provide, for example, the benefits of a planar interface surface. Additional and/or intervening spacers, bonds and other layers can be provided to provide desired electrical, thermal, and mechanical interfaces. Depending on the desired electrical, thermal, and/or mechanical properties desired, the layers can be made of electrically and/or thermally conductive and/or insulative materials.

In some embodiments, exposed surfaces of the first auxiliary spacer 246a, the second auxiliary spacer 246b, the spacer 245, gate connection pad 282, and/or the drain connection pad 284 may be substantially coplanar. That is, the RF transistor amplifier 200E may be configured to be mounted to a separate board (e.g., via an attachment method such as solder and the like).

It will be understood the a method of manufacturing of RF transistor amplifier 200E may be similar to that of RF transistor amplifiers 200A and 200B illustrated with respect to FIGS. 3A to 3F. For example, manufacturing the RF transistor amplifier 200E may include the placement of the first auxiliary spacer 246a on the first circuit element 350a and the placement of the second auxiliary spacer 246b on the second circuit element 350b. For example, the first auxiliary spacer 246a and the second auxiliary spacer 246b may be electrically and/or thermally connected to the first and second circuit elements 350a, 350b, respectively (e.g., via die attach material). This step could be performed, for example, in a manner similar to the placement of the spacer 245 on the RF transistor amplifier die 10 (illustrated with respect to FIG. 3D). Depositing the encapsulating material 325 (illustrated with respect to FIG. 3F) may then be performed to form the encapsulating material 325 on portions of the first and/or second auxiliary spacers 246a, 246b and to expose a portion (e.g., a surface) of the first and/or second auxiliary spacers 246a, 246b.

FIG. 6B illustrates an RF transistor amplifier 200F including first and/or second auxiliary spacers 246a, 246b that is similar to the RF transistor amplifier 200C of FIGS. 4A to 4C. The RF transistor amplifier 200F may include the first and/or second auxiliary spacers 246a, 246b on the first and/or second circuit elements 350a, 350b, respectively, and may expose the gate lead pad 382 and/or the drain lead pad 384. The first and/or second auxiliary spacers 246a, 246b of the RF transistor amplifier 200F may be similar to those of FIG. 6A and a duplicate description thereof will be omitted.

As discussed above, in some embodiments, the first auxiliary spacer 246a, the second auxiliary spacer 246b, and the spacer 245 may be interconnected and/or integrally formed. FIG. 6C illustrates an embodiment of an RF transistor amplifier 200F' having an integrated spacer layer 245'. The integrated spacer layer 245' may extend to be connected to and/or contact the first circuit element 350a, the second circuit element 350b, and the RF transistor amplifier die 10 (e.g., source terminal 26 of the RF transistor amplifier die 10). In some embodiments, a surface 245a' of the integrated spacer layer 245' may be exposed from the encapsulating material 325. In some embodiments, the integrated spacer layer 245' may be formed of a same or similar material as the first auxiliary spacer 246a, the second auxiliary spacer 246b, and/or the spacer 245 described with respect to previous embodiments. For example, the integrated spacer layer 245' may be formed of an electrically and/or thermally conductive material, such as metal. In some embodiments, the integrated spacer layer 245' may be or include gold (Au) Copper (Cu), a Cu alloy, gold-tin (AuSn), and/or epoxy, though the present invention is not limited thereto.

Though the spacer 245 is illustrated as a uniform layer having a relatively planar upper surface 245b', the present invention is not limited thereto. In some embodiments, the upper surface 245b' of the integrated spacer layer 245' may be non-planar. For example, in some embodiments the first circuit element 350a, the second circuit element 350b, and the RF transistor amplifier die 10 may have different heights, and the integrated spacer layer 245' may be formed to have an upper surface 245b' with portions at each of the different heights of the first circuit element 350a, the second circuit element 350b, and the RF transistor amplifier die 10.

FIG. 6D illustrates an embodiment of an RF transistor amplifier 200G in which the first auxiliary spacer 246a and the second auxiliary spacer 246b are omitted. Referring to FIG. 6D, a surface 350a_s of the first circuit element 350a and/or a surface 350b_s of the second circuit element 350b may be exposed. The exposure of the surfaces 350a_s, 350b_s of the first and/or second circuit elements 350a, 350b may allow for additional external connections to be applied to the first and/or second circuit elements 350a, 350b. For example, separate electrical connections, such as to a ground signal, may be connected to the first and/or second circuit elements 350a, 350b by way of their respective exposed surfaces 350a s, 350b_s.

The RF transistor amplifier 200G of FIG. 6D may be formed, for example, by constructing the RF transistor amplifier 200C of FIG. 4A and then performing a planarizing operation on portions of the encapsulating material 325 to expose the surfaces 350a_s, 350b_s of the first and/or second circuit elements 350a, 350b.

The RF transistor amplifiers 200E, 200F, 200F', and 200G illustrated in FIGS. 6A to 6D may be utilized in multiple packaging configurations. FIGS. 7A to 7F illustrate the use of packaging similar to that discussed herein with respect to FIGS. 2B, 2C, 4B and 4C. For example, the interconnect structure 210 and the RF transistor amplifier die 10 may be placed in an open-cavity semiconductor package 7000a_1, 7000a_2 (FIGS. 7A and 7B) or an OMP package 7000b_1, 7000b_2 (FIGS. 7C and 7D). Elements in FIGS. 7A and 7C of the semiconductor package 7000a_1 and semiconductor package 7000b_1 that are similar to those previously discussed with respect to FIGS. 2B and 2C will not be discussed further for the sake of brevity. Elements in FIGS. 7B and 7D of the semiconductor package 7000a2 and semiconductor package 7000b_2 that are similar to those previously discussed with respect to FIGS. 4B and 4C will not be discussed further for the sake of brevity.

Figure 7A:
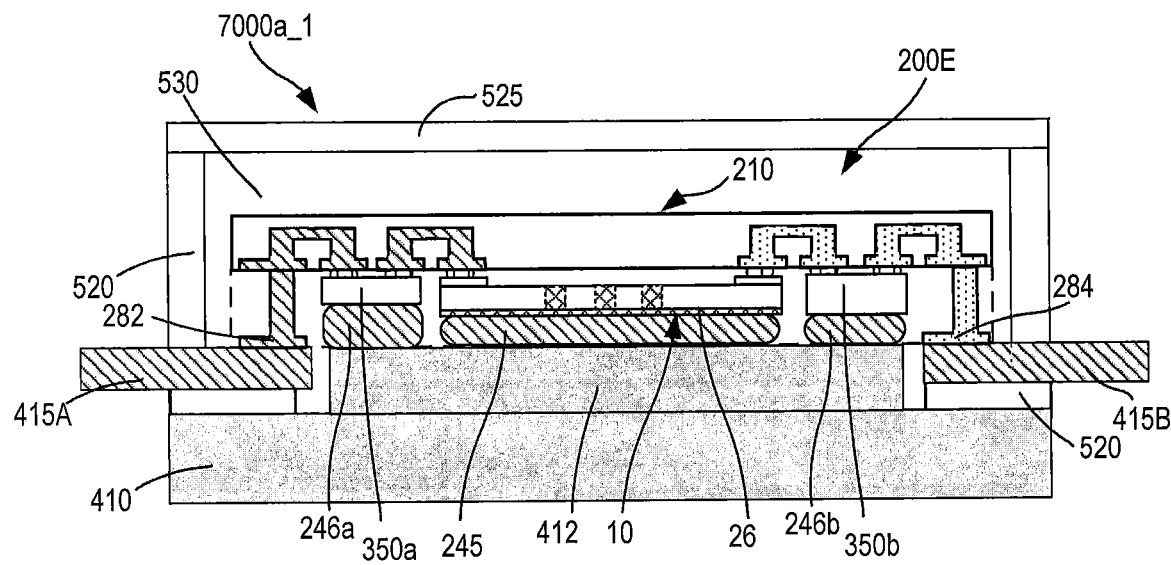
FIGS. 7A to 7F are schematic cross-sectional views of examples of packaging options for the RF transistor amplifiers of FIGS. 6A to 6D.
Figure 7B:
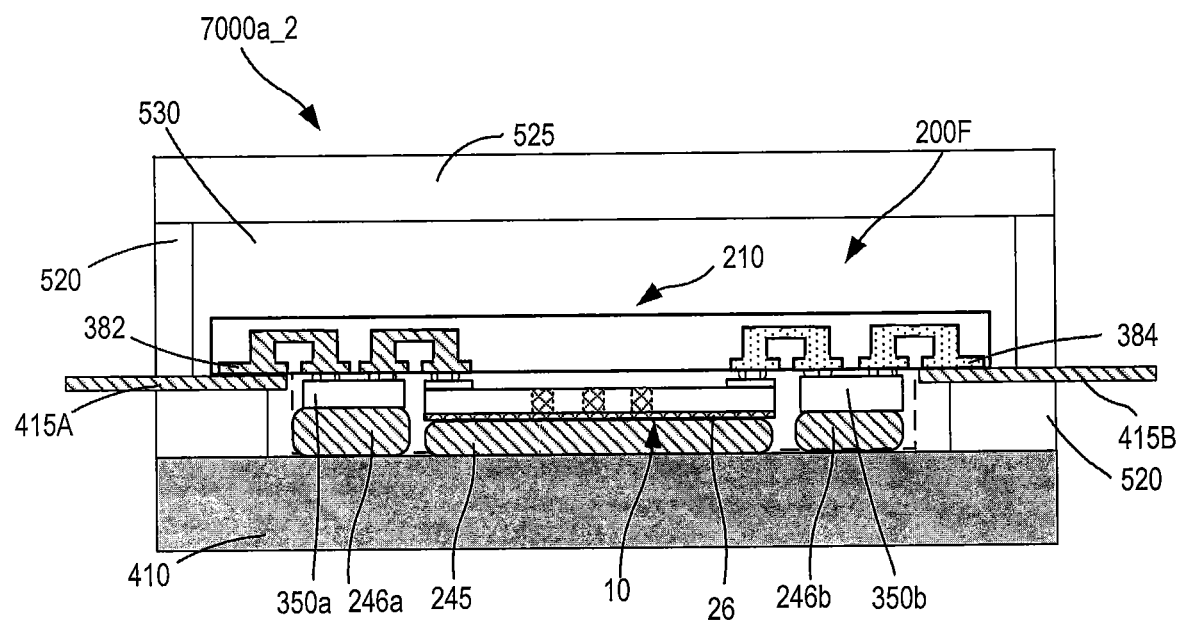
Figure 7C:
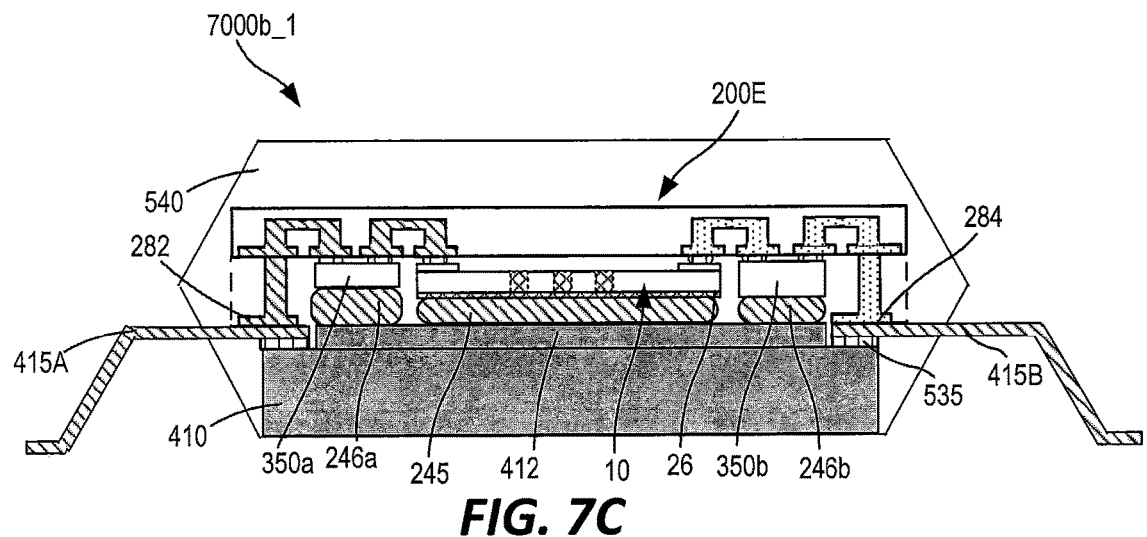
Figure 7D:
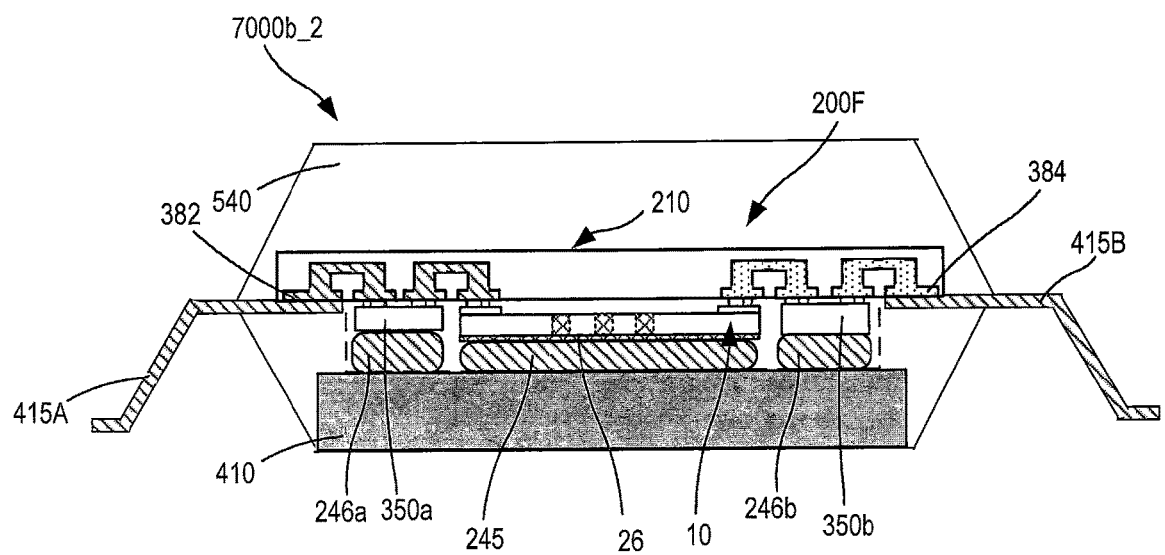

In FIGS. 7A and 7C, semiconductor packages 7000a_1 and 7000b_1 illustrate the use of interconnect structure 210 of RF transistor amplifier 200E with the first and second auxiliary spacers 246a, 246b. The RF transistor amplifier 200E may expose gate connection pad 282 and drain connection pad 284 that may be connected to leads 415A, 415B, respectively. In some embodiments, the semiconductor packages 7000a_1 and 7000b_1 may accommodate an RF transistor amplifier 200E where the first auxiliary spacer 246a, the second auxiliary spacer 246b, the spacer 245, the gate connection pad 282, and drain connection pad 284 are substantially coplanar. Depending on the electrical and thermal requirements for the first and second circuit elements 350a, 350b, additional terminal/bonding/spacer structures can be utilized with at least one of the first and second circuit elements 350a, 350b to provide an electrical, thermal, and/or mechanical interface between one of more of the at least one of the first and second circuit elements 350a, 350b and the carrier substrate 410 in a similar manner as described for the bonding/spacer to the RF transistor amplifier die 10.

FIGS. 7A and 7B also illustrate the use of a riser 412. The riser 412 may be a portion of the carrier substrate 410 or an additional separate structure. In some embodiments, the riser 412 may include elements such as, for example, a spacer (e.g., composed similarly to spacer 425 and/or first and second auxiliary spacers 246a, 246b), a bonding/attach layer (e.g., a eutectic layer, an epoxy layer), a metal layer, and/or a thermally conductive layer. The riser 412 may be formed of one or multiple layers. In some embodiments, the riser 412 may be utilized to raise a level of the RF transistor amplifier 200E and/or provide a planar surface for mounting the RF transistor amplifier 200E.

In FIGS. 7B and 7D, semiconductor packages 7000a_2 and 7000b_2 illustrate the use of interconnect structure 210 of RF transistor amplifier 200F with the first and second auxiliary spacers 246a, 246b. The RF transistor amplifier 200F may expose gate lead pad 382 and drain lead pad 384 that may be connected to leads 415A, 415B, respectively. In some embodiments, the semiconductor packages 7000a_2 and 7000b_2 may accommodate an RF transistor amplifier 200E where the first auxiliary spacer 246a, the second auxiliary spacer 246b, and the spacer 245 are on a different level (e.g., at a different height) than the gate lead pad 382 and drain lead pad 384. In FIGS. 7B and 7D, RF transistor amplifier 200F is illustrated in the semiconductor packages 7000a_2, 7000b_2, but it will be understood that the RF transistor amplifiers 200F', 200G of FIGS. 6C and 6D could also be packaged similarly, mutatis mutandis.

Referring to FIGS. 7A to 7D, the first and second auxiliary spacers 246a, 246b may be connected to and/or directly contact the carrier substrate 410. In this manner, the first and second auxiliary spacers 246a, 246b may be configured to thermally dissipate heat from and/or provide an electrical signal (e.g., a ground signal) to the first and second circuit elements 350a, 350b. For example, in some embodiments, first and second auxiliary spacers 246a, 246b may be electrically conductive and may serve to electrically connect the first and second circuit elements 350a, 350b to the carrier substrate 410. In some embodiments, first and second auxiliary spacers 246a, 246b may be electrically insulating or conductive, but may thermally connect the first and second circuit elements 350a, 350b to the carrier substrate 410 so as to dissipate thermal energy (e.g., heat) from the first and second circuit elements 350a, 350b.

Figure 7E:
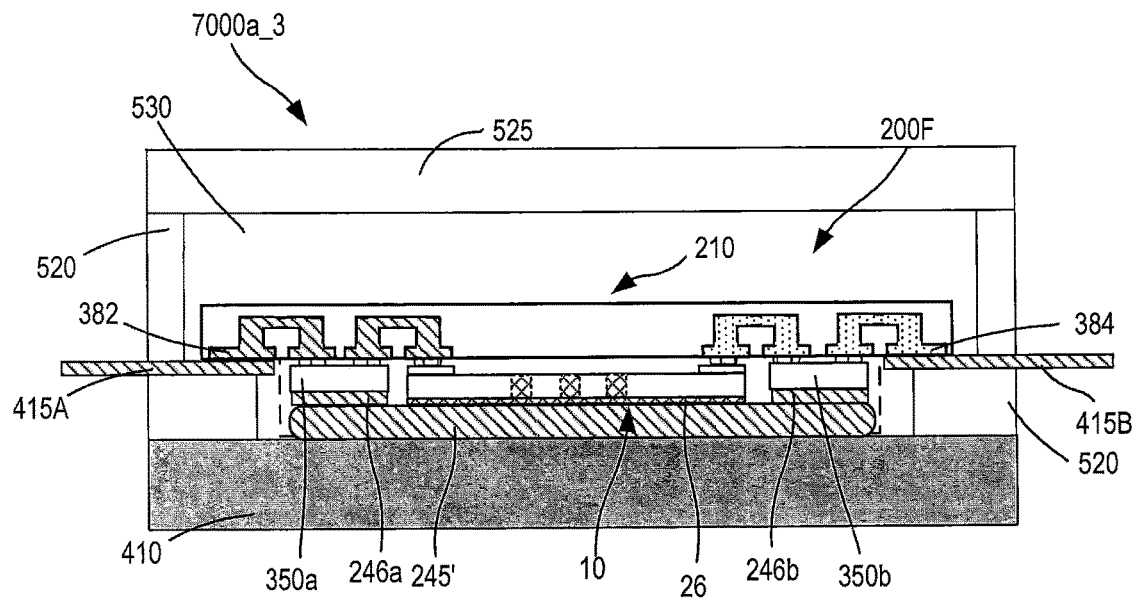
Figure 7F:
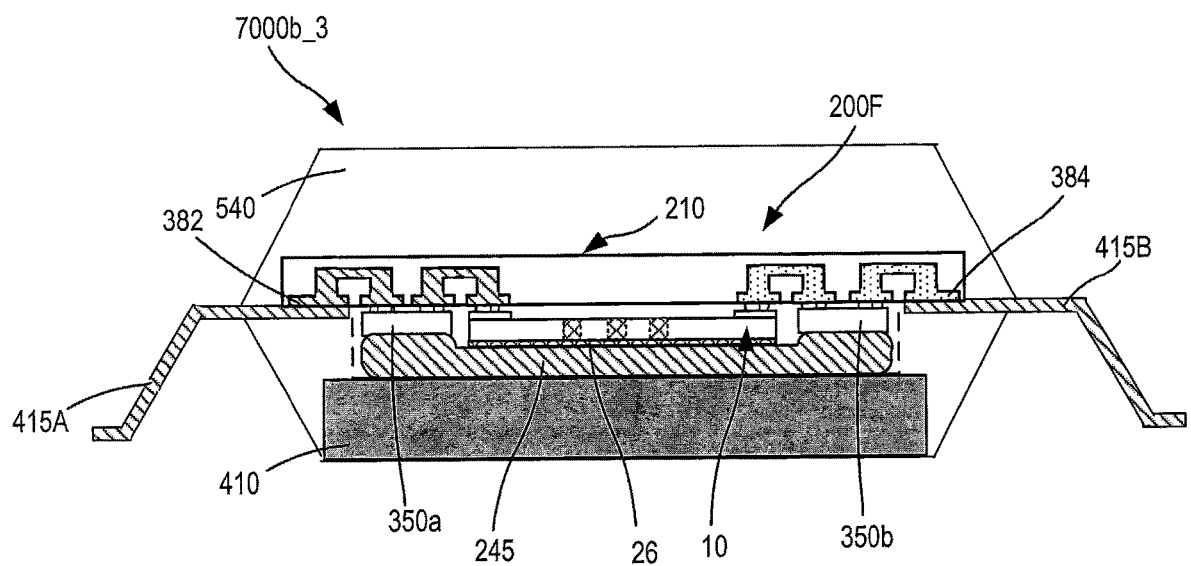

FIGS. 7E and 7F illustrate example semiconductor packages 7000a_3, 7000b_3 that incorporate an integrated spacer layer 245'. FIG. 7E illustrates an open-cavity semiconductor package 7000a_3 and FIG. 7F illustrates an OMP semiconductor package 7000b_3. The semiconductor packages 7000a_3, 7000b_3 may utilize the integrated spacer layer 245'. As illustrated in FIG. 7E, some embodiments of the present invention may incorporate the first and second auxiliary spacers 246a, 246b in addition to the integrated spacer layer 245'. For example, the first and second auxiliary spacers 246a, 246b may be disposed between the integrated spacer layer 245' and one or more of the first and second circuit elements 350a, 350b. The first and second auxiliary spacers 246a, 246b may be utilized to extend between the integrated spacer layer 245' and one or more of the first and second circuit elements 350a, 350b so as to provide a planar connection surface. In some embodiments, the first and second auxiliary spacers 246a, 246b may be omitted. For example, the integrated spacer layer 245' may be configured to have a surface that is non-planar so as to couple to the first circuit element 350a, the second circuit element 350b, and the RF transistor amplifier die 210. Such an embodiment is shown in FIG. 7F.

Figure 8C:
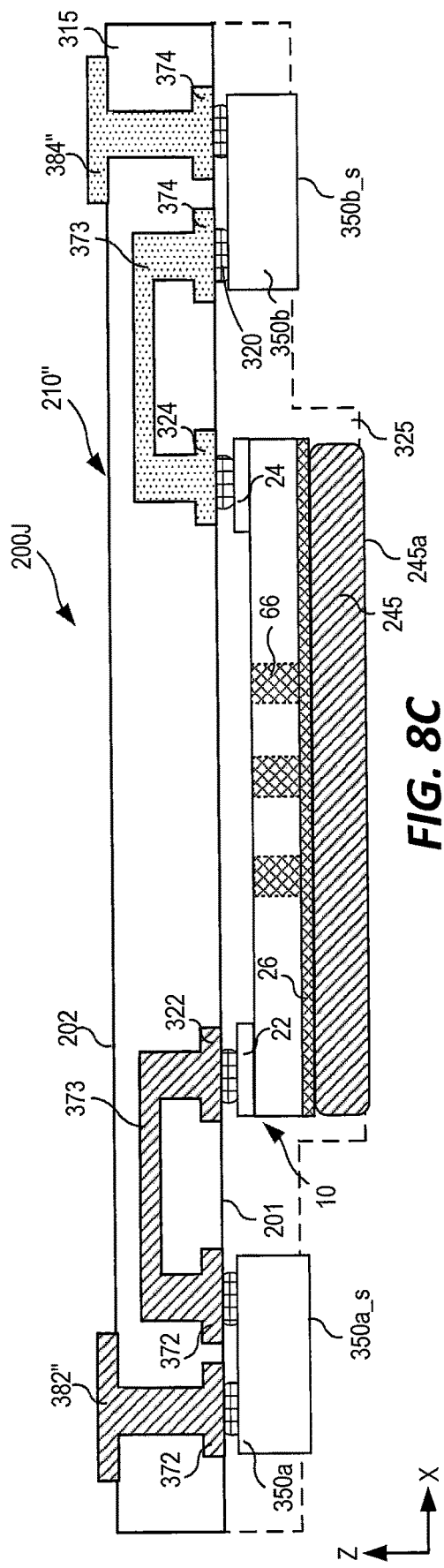

FIGS. 8A to 8C are schematic cross-sectional views of additional RF transistor amplifier embodiments 200H, 200I, 200J incorporating mechanisms to couple to the first and second circuit elements 350a, 350b, according to some embodiments of the present invention. Portions of the RF transistor amplifiers 200H, 200I, 200J may be substantially similar to that of FIGS. 5A, 6B, 6C and 6D and, as such, a duplicate description thereof will be omitted. The embodiments of FIGS. 8A to 8C may, for example, incorporate an interconnect structure 210" that exposes a gate lead pad 382" and/or a drain lead pad 384" on second side 202 (e.g., an upper surface) of the interconnect structure 210". The embodiment of the RF transistor amplifier 200H of FIG. 8A, for example, may include an embodiment similar to that of the RF transistor amplifier 200D of FIG. 5A with the addition of a first auxiliary spacer 246a and a second auxiliary spacer 246b.

In some embodiments, the first auxiliary spacer 246a may be formed to be on and/or contact the first circuit element 350a and the second auxiliary spacer 246b may be formed to be on and/or contact the second circuit element 350b. In some embodiments, the first and/or second auxiliary spacers 246a, 246b may be formed of an electrically and/or thermally conductive material, such as metal. In some embodiments, a surface of the first and/or second auxiliary spacers 246a, 246b may be exposed from the encapsulating material 325. In some embodiments, the first and/or second auxiliary spacers 246a, 246b may be or include gold (Au) Copper (Cu), a Cu alloy, gold-tin (AuSn), and/or epoxy, though the present invention is not limited thereto. The first and/or second auxiliary spacers 246a, 246b may provide a mechanism by which a ground signal is provided to, or thermal energy is dissipated from, the first and/or second circuit elements 350a, 350b, as discussed herein with respect to other embodiments.

In some embodiments, the first and/or second auxiliary spacers 246a, 246b may be composed of a similar material as the spacer 245, though the present invention is not limited thereto. In some embodiments, the first and/or second auxiliary spacers 246a, 246b may be composed of a different material than the spacer 245. In some embodiments, the first and/or second auxiliary spacers 246a, 246b may be electrically disconnected (e.g., isolated) from the spacer 245.

Though the first auxiliary spacer 246a, the second auxiliary spacer 246b, and the spacer 245 are illustrated as separate discrete elements, the present invention is not limited thereto. In some embodiments, the first auxiliary spacer 246a, the second auxiliary spacer 246b, and the spacer 245 may be formed as an integrated (e.g., interconnected) layer. Such an embodiment is illustrated in FIG. 8B, which represents an RF transistor amplifier 200I including a spacer layer 245'. The integrated spacer layer 245' may extend to contact the first circuit element 350a, the second circuit element 350b, and the RF transistor amplifier die 10 (e.g., source terminal 26 of the RF transistor amplifier die 10). In some embodiments, a surface of the integrated spacer layer 245' may be exposed from the encapsulating material 325. In some embodiments, the integrated spacer layer 245' may be formed of a same or similar material as the first auxiliary spacer 246a, the second auxiliary spacer 246b, and/or the spacer 245. Though illustrated as a uniform layer having a relatively planar upper surface 245b', the present invention is not limited thereto. In some embodiments, the upper surface 245b' of the integrated spacer layer 245' may be non-planar. For example, in some embodiments the first circuit element 350a, the second circuit element 350b, and the RF transistor amplifier die 10 may have different heights, and the integrated spacer layer 245' may be formed to have an upper surface 245b' with portions at each of the different heights of the first circuit element 350a, the second circuit element 350b, and the RF transistor amplifier die 10.

FIG. 8C illustrates an embodiment of an RF transistor amplifier 200J in which the first auxiliary spacer 246a and the second auxiliary spacer 246b are omitted. The RF transistor amplifier 200J may incorporate an interconnect structure 210" similar to that of FIG. 5A and, as such, a duplicate description thereof will be omitted. Referring to FIGS. 5A and 8C, an upper surface 350a_s of the first circuit element 350a and/or an upper surface 350b_s of the second circuit element 350b may be exposed from the encapsulating material 325. The exposure of the surfaces 350a_s, 350b_s of the first and/or second circuit elements 350a, 350b may allow for additional external connections to be applied to the first and/or second circuit elements 350a, 350b. For example, separate electrical connections, such as to a ground signal, may be connected to the first and/or second circuit elements 350a, 350b by way of their respective exposed surfaces 350a_s, 350b_s.

The RF transistor amplifier 200J of FIG. 8C may be formed, for example, by constructing the RF transistor amplifier 200D of FIG. 5A and then performing a planarizing operation on portions of the encapsulating material 325 to expose the surfaces 350a_s, 350b_s of the first and/or second circuit elements 350a, 350b.

The RF transistor amplifiers 200H, 200I, and 200J illustrated in FIGS. 8A to 8C may be utilized in multiple packaging configurations. FIGS. 9A to 9D illustrate the use of packaging similar to that discussed herein with respect to FIGS. 5B and 5C. For example, the interconnect structure 210" and the RF transistor amplifier die 10 may be placed in an open-cavity semiconductor package 9000a (FIG. 9A) or an OMP package 9000b (FIG. 9B). In some embodiments, an integrated spacer layer 245' may be utilized with an open-cavity semiconductor package 9000c (FIG. 9C) or an OMP package 9000d (FIG. 9D). Elements in FIGS. 9A to 9D of the semiconductor packages 9000a, 9000b, 9000c, and 9000d that are similar to those previously discussed with respect to FIGS. 5B and 5C will not be discussed further for the sake of brevity. In some embodiments, the semiconductor packages 9000a to 9000d may accommodate an RF transistor amplifier 200H where the gate lead pad 382" and drain lead pad 384" are exposed on an upper surface of the interconnect structure 210". In FIGS. 9A to 9D, transistor amplifier 200H is illustrated in the semiconductor packages 9000a, 9000b, but it will be understood that the RF transistor amplifiers 200I and 200J could also be packaged similarly, mutatis mutandis.

Figure 9A:
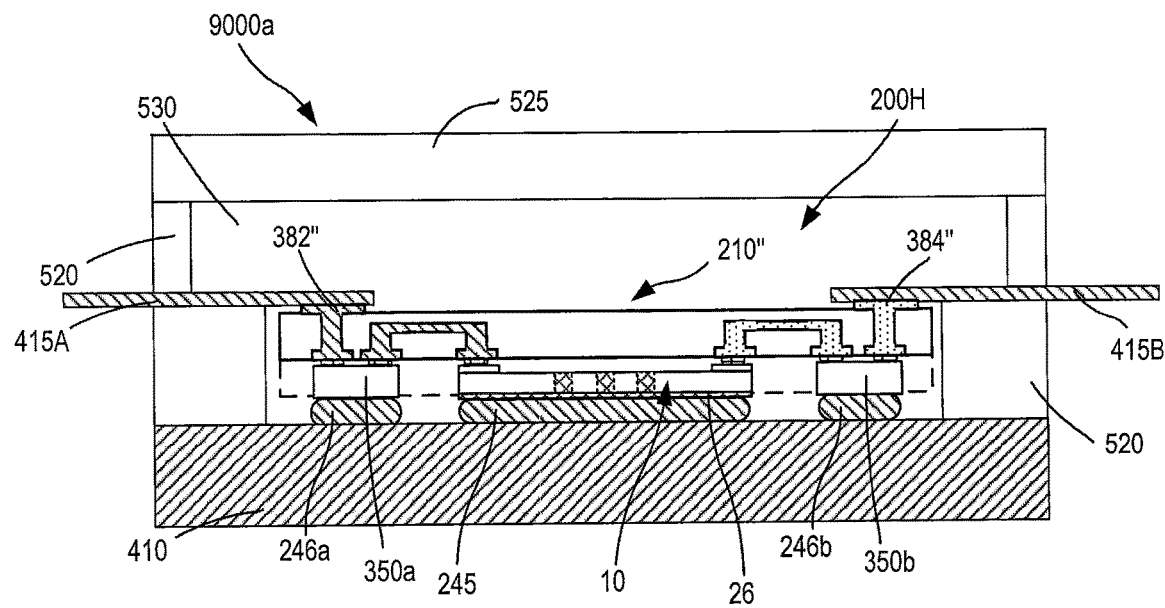
FIGS. 9A to 9D are schematic cross-sectional view of examples of packaging options for the RF transistor amplifiers of FIGS. 8A to 8C.
Figure 9B:
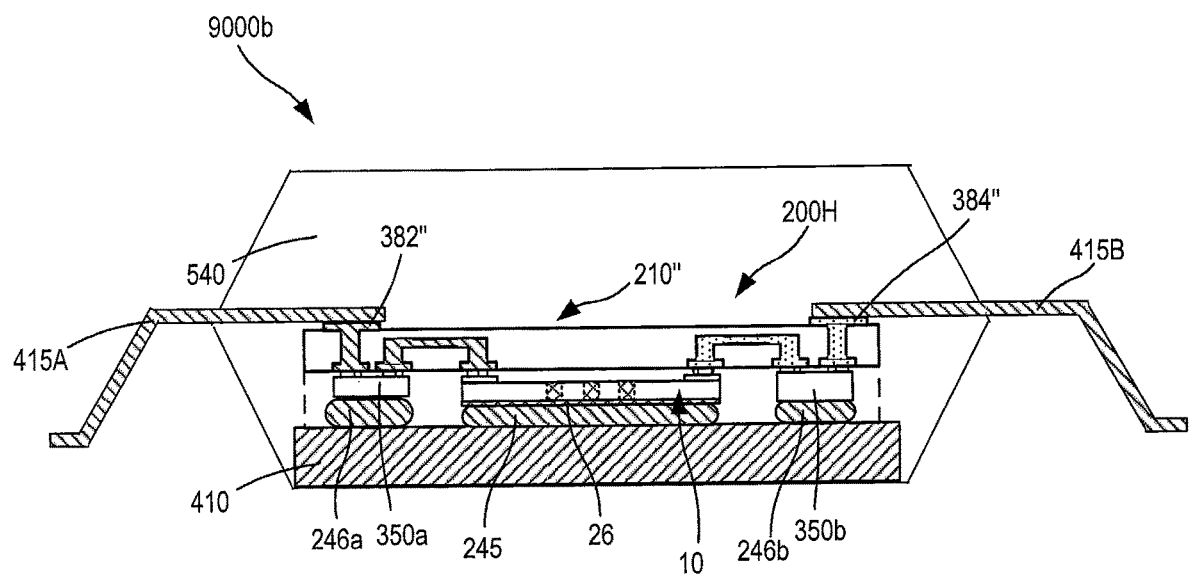

Referring to FIGS. 9A and 9B, the first and second auxiliary spacers 246a, 246b may be connected and/or directly contact the carrier substrate 410. In this manner, the first and second auxiliary spacers 246a, 246b may be configured to thermally dissipate heat from and/or provide an electrical signal (e.g., a ground signal) to the first and second circuit elements 350a, 350b. Depending on the electrical and thermal requirements for the first and second circuit elements 350a, 350b, additional terminal/bonding/spacer structures can be utilized with at least one of the first and second circuit elements 350a, 350b to provide an electrical, thermal, and/or mechanical interface between one of more of the at least one of the first and second circuit elements 350a, 350b and the substrate 410 in a similar manner as described for the bonding/spacer to the RF transistor amplifier die 10.

Figure 9C:
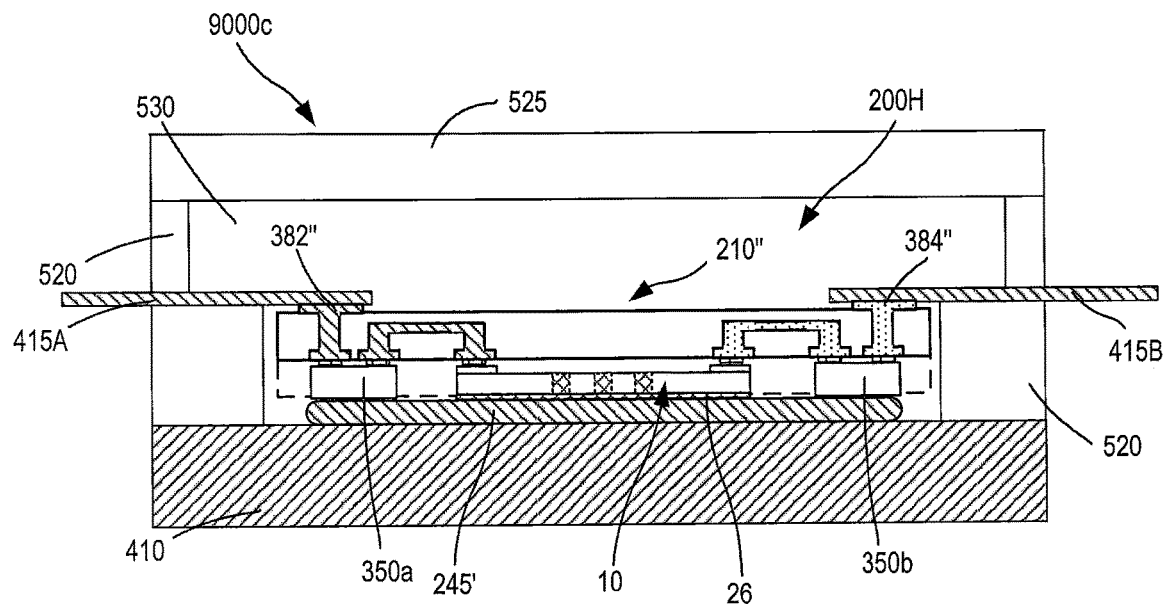
Figure 9D:
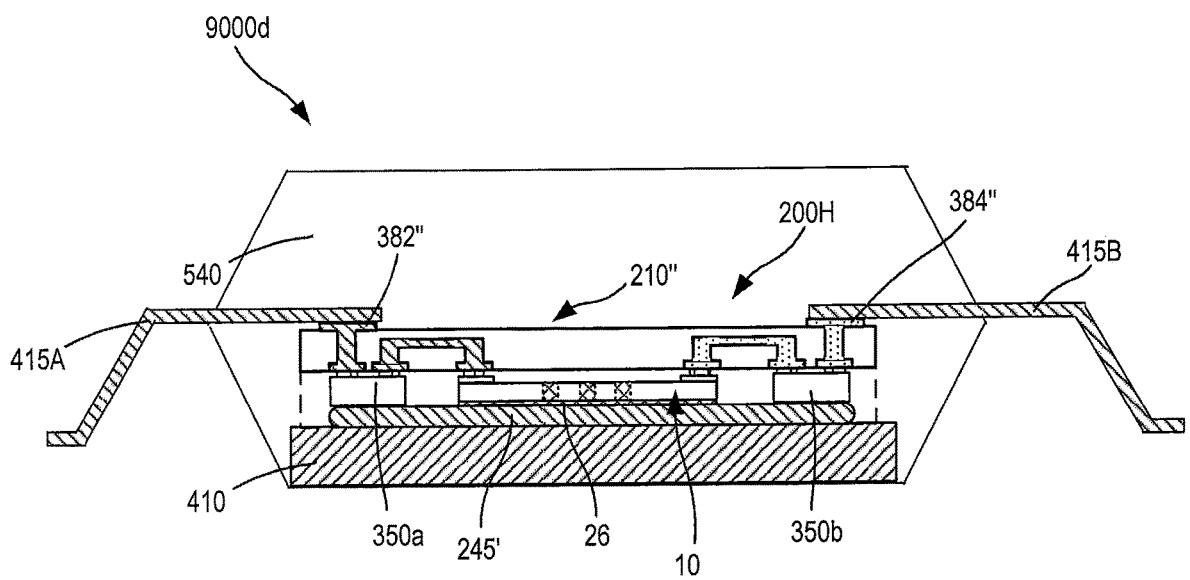

Referring to FIGS. 9C and 9D, the first and second auxiliary spacers 246a, 246b may be replaced with an integrated spacer layer 245' that is coupled to the first circuit element 350a, the second circuit element 350b, and the RF transistor amplifier die 10. Though illustrated as having a planar upper surface, in some embodiments, the integrated spacer layer 245' may have a non-planar upper surface (such as that illustrated in FIG. 7D). In some embodiments, the first and second auxiliary spacers 246a, 246b may be respectively disposed between the first and second circuit elements 350a, 350b and the integrated spacer layer 245' (such as that illustrated in FIG. 7C).

The RF transistor amplifiers according to embodiments of the present invention may have a number of advantages as compared to conventional RF transistor amplifiers. The reduction in bond wires (or eliminating the bond wires entirely) may reduce costs and simplify manufacturing, and may improve the RF performance of the device since the amount of inductance in the impedance matching networks may be tightly controlled, and the problem of too much inductance in the matching networks can be avoided. Moreover, increased wafer level packaging becomes possible with the RF transistor amplifiers according to embodiments of the present invention, which may further simplify manufacturing and/or reduce production costs. In addition, the use of the interconnect structure may allow for a more modular products, such that portions of the RF transistor amplifier can be changed with relative ease.

Embodiments of the present disclosure can be used, for example, in RF power products for 5G and base station and/or handset applications, as well as in radar applications.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A radio frequency ("RF") transistor amplifier, comprising:
    an RF transistor amplifier die;
    an interconnect structure having first and second opposing sides, wherein the first side of the interconnect structure is adjacent a first surface of the RF transistor amplifier die such that the interconnect structure and the RF transistor amplifier die are in a stacked arrangement;
    one or more circuit elements on the first and/or second side of the interconnect structure;
    an encapsulating material on the RF transistor amplifier die and the interconnect structure; and
    an auxiliary spacer on the one or more circuit elements.

2. The RF transistor amplifier of claim 1, wherein the RF transistor amplifier die further includes a gate terminal and a drain terminal on the first surface of the RF transistor amplifier die and a source terminal on a second surface of the RF transistor amplifier die.

3. The RF transistor amplifier of claim 2, further comprising a spacer that is on and electrically connected to the source terminal of the RF transistor amplifier die.

4. The RF transistor amplifier of claim 3, wherein the encapsulating material is also on the spacer.

5. The RF transistor amplifier of claim 3, wherein the spacer and the auxiliary spacer comprise a single monolithic structure.

6. The RF transistor amplifier of claim 1, wherein the one or more circuit elements include circuitry comprising at least part of harmonic terminating circuitry and/or impedance matching circuitry.

7. The RF transistor amplifier of claim 1, wherein the encapsulating material exposes a surface of the auxiliary spacer.

8. A radio frequency ("RF") transistor amplifier, comprising:
    an RF transistor amplifier die having a semiconductor layer structure;
    an interconnect structure having first and second opposing sides, wherein the first side of the interconnect structure is adjacent a first surface of the RF transistor amplifier die such that the interconnect structure and the RF transistor amplifier die are in a stacked arrangement;
    one or more circuit elements on the first and/or second side of the interconnect structure; and
    an encapsulating material on the RF transistor amplifier die and the interconnect structure,
    wherein the encapsulating material exposes a surface of the one or more circuit elements.

9. A radio frequency ("RF") transistor amplifier package comprising:
    an RF transistor amplifier die having a first major surface and a second major surface on an opposite side of the RF transistor amplifier die from the first major surface, the RF transistor amplifier die comprising a gate terminal and a drain terminal on the first major surface and a source terminal on the second major surface;
    an interconnect structure on the first major surface of the RF transistor amplifier die, the interconnect structure comprising a gate lead pad electrically coupled to the gate terminal and a drain lead pad electrically coupled to the drain terminal;
    an input lead extending from outside the RF transistor amplifier package and electrically coupled to the gate lead pad; and
    an output lead extending from outside the RF transistor amplifier package and electrically coupled to the drain lead pad,
    wherein the input lead is electrically coupled to the gate lead pad by a through via in an encapsulating material on the interconnect structure.

10. The RF transistor amplifier package of claim 9, wherein the interconnect structure further comprises:
    a first side adjacent the first major surface of the RF transistor amplifier die and a second side opposite the first side; and
    one or more circuit elements that are coupled between the gate terminal and the input lead and/or between the drain terminal and the output lead.

11. The RF transistor amplifier package of claim 10, further comprising an auxiliary spacer that is on the one or more circuit elements.

12. The RF transistor amplifier package of claim 9, further comprising a spacer that is on and electrically connected to the source terminal of the RF transistor amplifier die.

13. The RF transistor amplifier package of claim 12, further comprising a carrier substrate on the second major surface of the RF transistor amplifier die, with the spacer therebetween.

14. The RF transistor amplifier package of claim 13, wherein the spacer is electrically connected to the carrier substrate.

15. The RF transistor amplifier package of claim 9, wherein the interconnect structure comprises an input matching circuit and/or an output matching circuit.

16. A transistor amplifier package, comprising:
   a group III-nitride based amplifier die comprising a first major surface and a second major surface on an opposite side of the amplifier die from the first major surface, the amplifier die comprising a gate terminal and a drain terminal on the first major surface and a source terminal on the second major surface; and
   an interconnect structure on the first major surface of the amplifier die and electrically coupled to the gate terminal and drain terminal, wherein the interconnect structure comprises one or more circuit elements that are coupled between the gate terminal and a first lead of the transistor amplifier package and/or between the drain terminal and a second lead of the transistor amplifier package,
   wherein the interconnect structure has a first side and a second side that is on an opposite side of the interconnect structure from the first side, wherein the first side of the interconnect structure is adjacent the first major surface of the amplifier die,
   wherein the first lead and the second lead are coupled to the first side of the interconnect structure or the second side of the interconnect structure.

17. The transistor amplifier package of claim 16, wherein the one or more circuit elements are mounted on the first side and/or second side of the interconnect structure.

18. The transistor amplifier package of claim 16, further comprising a spacer that is on and electrically connected to the source terminal of the amplifier die.

19. The transistor amplifier package of claim 18, further comprising an encapsulating material on the amplifier die, the interconnect structure, and the spacer.

20. The transistor amplifier package of claim 19, further comprising an auxiliary spacer on at least one of the one or more circuit elements.

21. The transistor amplifier package of claim 16, wherein the one or more circuit elements include circuitry comprising at least part of harmonic terminating circuitry and/or impedance matching circuitry.

22. A radio frequency ("RF") transistor amplifier, comprising:
   an RF transistor amplifier die;
   an interconnect structure having first and second opposing sides, wherein the first side of the interconnect structure is adjacent a first surface of the RF transistor amplifier die such that the interconnect structure and the RF transistor amplifier die are in a stacked arrangement;
   one or more harmonic terminating circuit elements and/or impedance matching circuit elements on the second side of the interconnect structure; and
   an encapsulating material on the RF transistor amplifier die and the interconnect structure.

23. The RF transistor amplifier of claim 22, wherein the RF transistor amplifier die comprises a gate terminal, the RF transistor amplifier further comprising:
   a gate lead pad that is electrically coupled to the gate terminal;
   an input lead that is electrically coupled to the gate lead pad by a through via in the encapsulating material.

24. A radio frequency ("RF") transistor amplifier, comprising:
   an RF transistor amplifier die that comprises a gate terminal;
   an interconnect structure having first and second opposing sides, wherein the first side of the interconnect structure is adjacent a first surface of the RF transistor amplifier die such that the interconnect structure and the RF transistor amplifier die are in a stacked arrangement;
   a circuit element on the first side of the interconnect structure that is coupled to the gate terminal;
   an encapsulating material on the RF transistor amplifier die, the circuit element and the interconnect structure; and
   an input lead that is electrically coupled to the circuit element by a through via in the interconnect structure.

* * * * *

UNITED STATES PATENT AND TRADEMARK OFFICE
CERTIFICATE OF CORRECTION

PATENT NO. : 11,837,457 B2
APPLICATION NO. : 17/018721
DATED : December 5, 2023
INVENTOR(S) : Noori et al.

Page 1 of 1

It is certified that error appears in the above-identified patent and that said Letters Patent is hereby corrected as shown below:

On the Title Page

Item [71]: correct "Cree, Inc." to read --Wolfspeed, Inc.--

In the Specification

Column 6, Line 48: correct "3d" to read --30--

Column 26, Line 59: correct "350$a$ s," to read --350$a\_s$,--

Signed and Sealed this
Thirteenth Day of February, 2024

Katherine Kelly Vidal
*Director of the United States Patent and Trademark Office*